(12) United States Patent  
Nakatake et al.

(10) Patent No.: US 7,193,907 B2  
(45) Date of Patent: Mar. 20, 2007

(54) SEMICONDUCTOR INTEGRATED CIRCUIT HAVING A POWER-ON RESET CIRCUIT IN A SEMICONDUCTOR MEMORY DEVICE

(75) Inventors: Yoshihiro Nakatake, Miyazaki (JP); Akihiro Narumi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/065,200

(22) Filed: Feb. 25, 2005

(65) Prior Publication Data

US 2005/0190627 A1 Sep. 1, 2005

(30) Foreign Application Priority Data

Feb. 26, 2004 (JP) .............................. 2004/051894

(51) Int. Cl.  
G11C 16/06 (2006.01)

(52) U.S. Cl. .................. 365/189.09; 365/194; 365/226

(58) Field of Classification Search ........... 365/189.09, 365/189.08, 193, 194, 226, 227; 331/49, 331/185, 186; 327/143, 536, 537  
See application file for complete search history.

(56) References Cited

U.S. PATENT DOCUMENTS

| 4,933,902 A | * | 6/1990 | Yamada et al. | ........ 365/189.08 |
| 5,365,481 A | | 11/1994 | Sawada | |
| 5,436,586 A | * | 7/1995 | Miyamoto | ................... 327/530 |
| 5,936,443 A | | 8/1999 | Yasuda et al. | |
| 6,011,447 A | * | 1/2000 | Iwasaki | ...................... 331/185 |
| 6,552,946 B2 | | 4/2003 | Yokozeki | |
| 6,686,783 B1 | | 2/2004 | Huang | |

FOREIGN PATENT DOCUMENTS

| JP | 2002-299436 | 10/2000 |
| JP | 2002-50200 | 2/2002 |

* cited by examiner

Primary Examiner—Gene N. Auduong  
(74) Attorney, Agent, or Firm—Volentine & Whitt, P.L.L.C.

(57) ABSTRACT

A semiconductor integrated circuit, which operates in accordance with a power supply voltage and an external clock signal and includes a memory circuit, includes a control circuit, and first and second internal circuits. The control circuit controls the memory circuit in accordance with the power supply voltage. The first internal circuit generates an internal power supply voltage for the control circuit. The second internal circuit generates an internal clock signal for the control circuit. The semiconductor integrated circuit further includes first and second power-on reset circuits. The first power-on reset circuit generates a first power-on reset signal for the first internal circuit after the power supply voltage is generated. The second power-on reset circuit generates a second power-on reset signal for the control circuit. The second power-on reset signal is input to the control circuit after the internal clock signal is input to the control circuit.

29 Claims, 21 Drawing Sheets

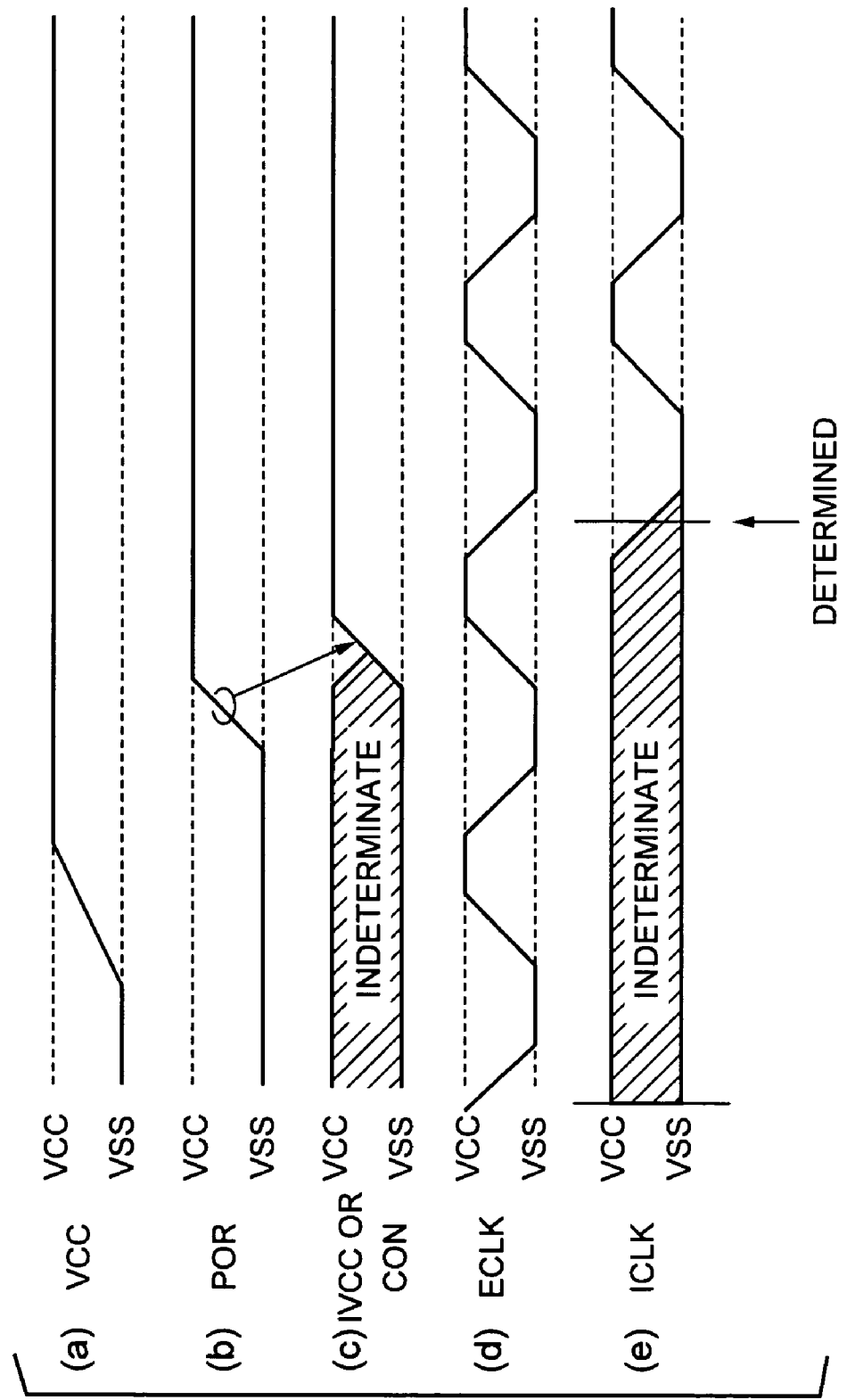

SEMICONDUCTOR INTEGRATED CIRCUIT HAVING A POWER-ON RESET CIRCUIT IN A SEMICONDUCTOR MEMORY DEVICE

BACKGROUND OF THE INVENTION

1. Field of the Invention

The present invention relates to a semiconductor integrated circuit, and in particular, to a semiconductor integrated circuit including a power-on reset circuit which resets an internal circuit in a semiconductor memory device during a start-up process of the semiconductor integrated circuit. This is a counterpart of and claims priority to Japanese Patent Application No. 2004-51894 filed on Feb. 26, 2004, which is herein incorporated by reference.

2. Description of the Related Art

FIG. 1 is a block diagram for describing a semiconductor integrated circuit in a semiconductor memory device of the related art. The semiconductor integrated circuit comprises a power-on reset circuit 100, an internal voltage generating circuit 200, a control circuit 300 and an internal clock generating circuit 400. A power supply voltage Vcc is externally input to the power-on reset circuit 100, the internal voltage generating circuit 200, the control circuit 300 and the internal clock generating circuit 400. Also, a clock signal ECLK is externally input to the internal clock generating circuit 400.

During a start-up process of the semiconductor integrated circuit, the power-on reset circuit 100 generates a power-on reset signal POR based on the power supply voltage Vcc. The power-on reset signal POR is input to the internal voltage generating circuit 200 and the control circuit 300. The power-on reset circuit 100 has circuitry as shown in FIG. 2A and outputs the power-on reset signal POR from an output terminal TPOR. The power-on reset circuit 100 has PMOS transistors P1–P5 which receives the power supply voltage Vcc and NMOS transistors N1–N5 which receives a ground voltage Vss. The PMOS transistors P1–P2 and the NMOS transistor N1 are coupled to a first node nd1 and the PMOS transistors P3–P5 and the NMOS transistors N2–N5 are coupled to a second node nd2. The power-on reset circuit 100 also has two inverters coupled in series between the second node nd2 and an output terminal TPOR. The power-on reset signal POR is output from the output terminal TPOR of the power-on reset circuit 100. The internal voltage generating circuit 200 generates an internal power supply voltage IVcc based on the power supply voltage Vcc for itself and the control circuit 300. The internal voltage generating circuit 200 is reset by the power-on reset signal POR. The internal clock generating circuit 400 generates an internal clock signal ICLK for the control circuit 300 based on the power supply voltage Vcc and the external clock signal ECLK. The internal clock generating circuit 400 includes a phase-locked loop circuit (hereinafter referred to as "PLL circuit"), and is not reset during the start-up process of the semiconductor integrated circuit. The PLL circuit in the internal clock generating circuit 400 outputs the internal clock signal ICLK after coincidence between the external clock signal ECLK and the internal clock signal ICLK. The control circuit 300 outputs a control signal CON in order to control a memory circuit of the semiconductor memory device in accordance with the power supply voltage Vcc, the internal power supply voltage IVcc and the internal clock signal ICLK. The control circuit 300 is reset by the power-on reset signal POR as well as the internal voltage generating circuit 200.

Each of the internal voltage generating circuit 200 and the control circuit 300 has an input set-reset circuit which is reset by the power-on reset signal POR. The input setting circuit is a flip-flop circuit which is reset when the power-on reset signal POR is kept in "Low" (hereinafter referred to as "L") level and is set when the power-on reset signal POR is kept in "High" (hereinafter referred to as "H") level. The input set-reset circuit in the control circuit 300 has circuitry 810 and an internal circuit 820 as shown in FIG. 2B. The circuitry 810 has two NAND circuits NA81 and NA82 and two inverters IV81 and IV82. The NAND circuit NA81 receives the internal clock signal ICLK and an output signal from the NAND circuit NA82. The inverter IV82 receives the power-on reset signal POR. The NAND circuit NA82 receives output signals from the NAND circuit NA81 and the inverter IV82. The inverter IV81 is coupled between the NAND circuit NA81 and the internal circuit 820. When it is necessary that a level on a node nd81 is kept in the "H" level by default configuration, the power-on reset signal POR has to turn to the "H" level when the internal clock signal ICLK is kept in the "H" level. Also, FIG. 2C is a block diagram for describing the PLL circuit 700 in the internal clock generating circuit 400. The PLL circuit 700 has a phase comparator 710, a charging pump 720, a loop filter 730, a voltage-controlled oscillator 740 and a frequency divider 750 coupled in series. When the power supply voltage Vcc is generated, the PLL circuit 700 operates so that a divided frequency clock signal DCLK can coincide in a phase with the external clock signal ECLK. After the coincidence between the phases of the divided frequency clock signal DCLK and the external clock signal ECLK, the internal clock signal ICLK output from a voltage-controlled oscillator 740 is stabilized.

FIGS. 3(a) through 3(e) are signal waveform diagrams for describing a reset operation of the semiconductor integrated circuit in FIG. 1. FIG. 3(a) represents a waveform of the power supply voltage Vcc, FIG. 3(b) represents a waveform of the power-on reset signal POR, FIG. 3(c) represents a waveform of the internal power supply voltage IVcc or the control signal CON, FIG. 3(d) represents a waveform of the external clock signal ECLK, and FIG. 3(e) represents a waveform of the internal clock signal ICLK. After the power supply voltage Vcc is generated as shown in FIG. 3(a), the power-on reset signal POR is turned from the "L" level to the "H" level as shown in FIG. 3(b). The internal power supply voltage IVcc or the control signal CON, which was indeterminate before the power supply voltage Vcc is generated, is determined by being reset in accordance with the rising edge of the power-on reset signal POR as shown in FIG. 3(c). On the other hand, after the power supply voltage Vcc is generated, the internal clock signal ICLK, which was indeterminate before the power supply voltage Vcc is generated, is determined in accordance with the coincidence in the phases between the external clock signal ECLK and the divided frequency clock signal DCLK as shown in FIG. 3(e).

In addition, other semiconductor integrated circuits have been proposed as described in a Document 1 (Japanese Patent Publication Laid-open No. 2000-299436) and a Document 2 (Japanese Patent Publication Laid-open No. 2002-50200). These semiconductor integrated circuits have a latch circuit which is connected with an internal circuit, and the latch circuit can reset the internal circuit when the power supply voltage is generated.

However, it takes a long time for the internal clock signal ICLK to be determined in the PLL circuit 700 of the internal clock generating circuit 400 as described above. When the internal clock signal ICLK is determined after the timing of the rising edge of the power-on reset signal POR, at which the internal power supply voltage IVcc or the control signal CON is determined, the node nd81 of the control circuit 300 may not be kept in the "H" level by the default configuration. That is, the control circuit 300 may not be properly reset because the indeterminate internal clock signal ICLK is input to the control circuit 300. As stated above, in the semiconductor integrated circuit of the prior art which includes an internal circuit which needs not to be reset when the power supply voltage Vcc is generated (for example, the internal clock generating circuit 400), another internal circuit which operates based on an output signal from the internal circuit and which needs to be reset when the power supply voltage Vcc is generated (for example, the control circuit 300), and the other internal circuit which needs to be reset when the power supply voltage Vcc is generated (for example, the internal voltage generating circuit 200), these internal circuits, which need to be reset when the power supply voltage Vcc is generated, are reset by the same power-on reset signal in accordance with the rising edge of the power supply voltage Vcc. Hereupon, the another internal circuit operates based on the output signal from the internal circuit which needs not to be reset when the power supply voltage Vcc is generated. That is, the other internal circuit may receive the output signal from the internal circuit ahead of the power on reset signal. Therefore, on such an occasion as this, the other internal circuit may not be properly reset.

SUMMARY OF THE INVENTION

An object of the present invention is to properly reset the internal circuit which operates based on the output signal from the internal circuit which needs not to be reset when the power supply voltage is generated.

According to an aspect of the present invention, for achieving the above-mentioned object, there is provided a semiconductor integrated circuit which operates in accordance with a power supply voltage and an external clock signal in a semiconductor memory device and which includes a memory circuit storing electronic data. The semiconductor integrated circuit further includes a control circuit, a first internal circuit and a second internal circuit. The control circuit controls the memory circuit in accordance with the power supply voltage. The first internal circuit generates an internal power supply voltage for the control circuit, based on the power supply voltage. The second internal circuit generates an internal clock signal for the control circuit according to the external clock signal. The semiconductor integrated circuit still further includes first and second power-on reset circuits. The first power-on reset circuit generates a first power-on reset signal for the first internal circuit after the power supply voltage is generated. The second power-on reset circuit generates a second power-on reset signal for the control circuit. The second power-on reset signal is input to the control circuit after the internal clock signal is input to the control circuit.

According to another aspect of the present invention, for achieving the above-mentioned object, there is provided a semiconductor integrated circuit which operates in accordance with a power supply voltage and an external clock signal in a semiconductor memory device and which includes a memory circuit storing electronic data. The semiconductor integrated circuit further includes a control circuit, a first internal circuit and a second internal circuit. The control circuit controls the memory circuit in accordance with the power supply voltage. The first internal circuit is connected with the control circuit so as to provide an internal power supply voltage to the control circuit, based on the power supply voltage. The second internal circuit is connected with the control circuit so as to provide an internal clock signal to the control circuit, based on the external clock signal. The semiconductor integrated circuit still further includes a power-on reset circuit and a delay circuit. The power-on reset circuit is connected with the first internal circuit so as to provide a power-on reset signal to the first internal circuit. The delay circuit is connected between the control circuit and the power-on reset circuit. The delay circuit receives the power-on reset signal and then provides a delayed power-on reset signal based on the power-on reset signal to the control circuit. The control circuit receives the internal clock signal in advance of the delayed power-on reset signal.

The above and further aspects and novel features of the invention will more fully appear from the following detailed description, appended claims and the accompanying drawings.

BRIEF DESCRIPTION OF THE DRAWINGS

FIGS. 3(a) through 3(e) are signal waveform diagrams for describing a reset operation of the semiconductor integrated circuit in FIG. 1.

DETAILED DESCRIPTION OF THE PREFERRED EMBODIMENTS

Embodiments of the present invention will be described hereinafter with references to the accompanying drawings. The drawings used for this description illustrate major characteristic parts of embodiments in order that the present invention will be easily understood. However, the invention is not limited by these drawings.

Figure 1:
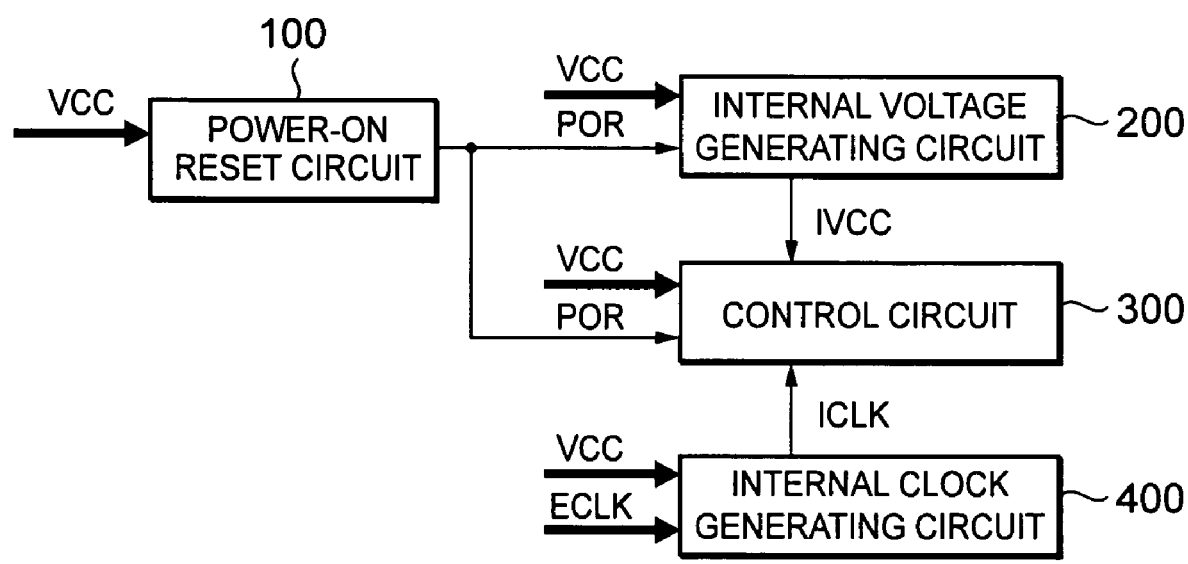
FIG. 1 is a block diagram for describing a semiconductor integrated circuit in a semiconductor memory device of the related art.
Figure 2A:
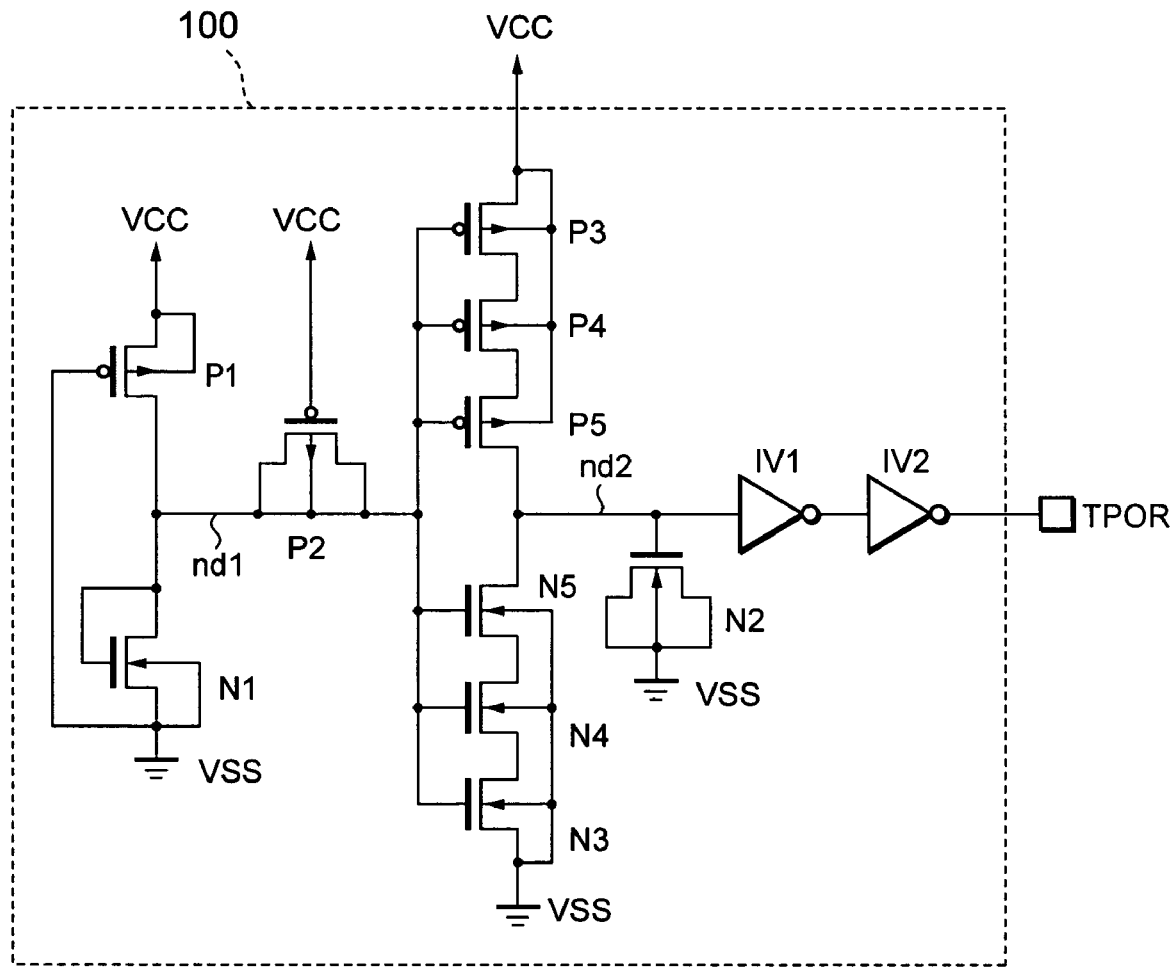
FIG. 2A is a schematic circuit diagram for describing a power-on reset circuit in FIG. 1.
Figure 2B:
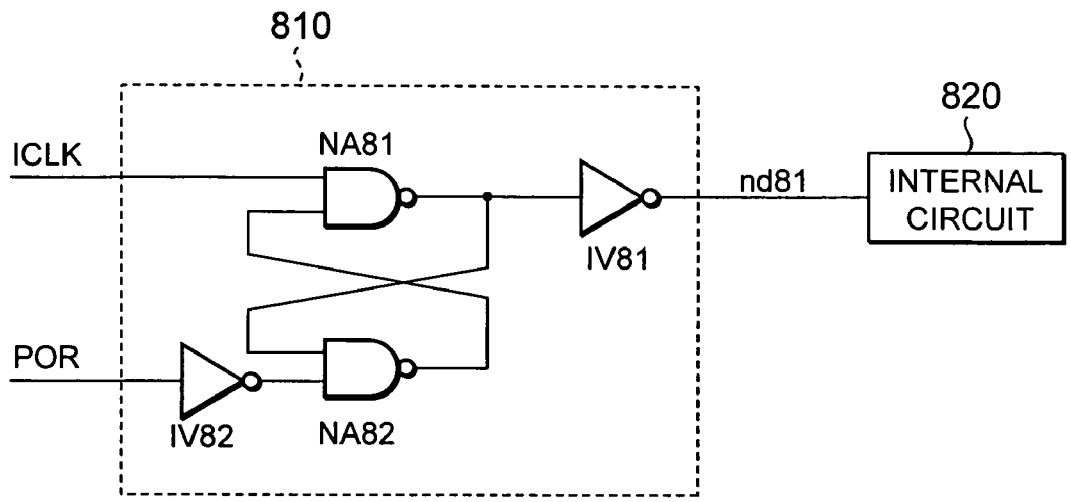
FIG. 2B is a schematic circuit diagram for describing an input set-reset circuit in FIG. 1.
Figure 2C:
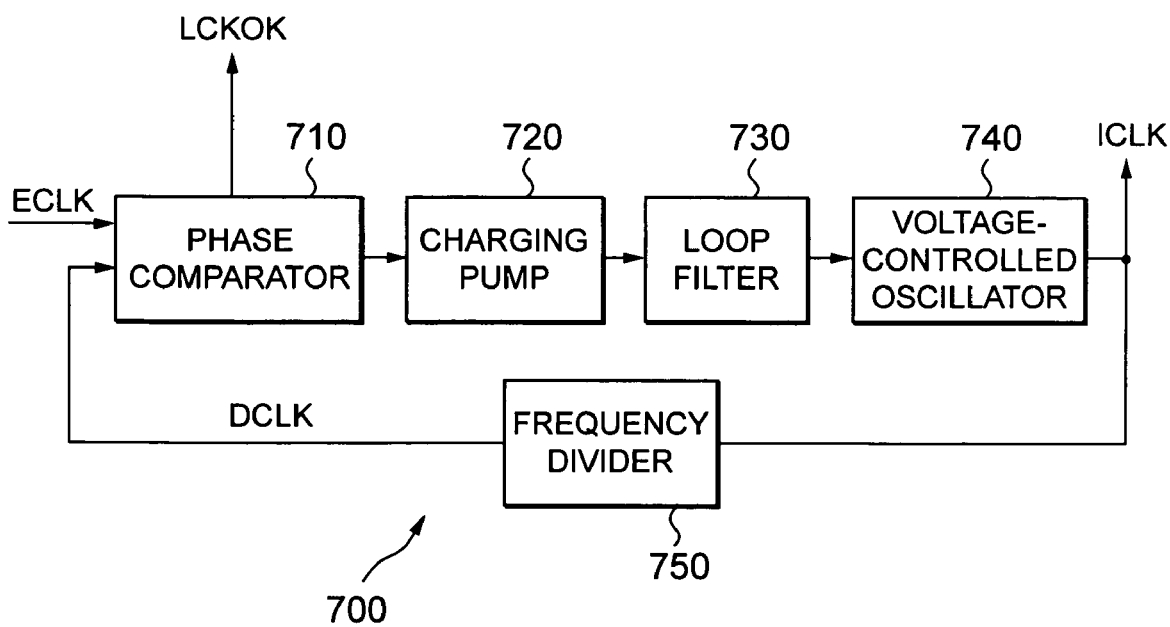
FIG. 2C is a block diagram for describing an internal clock generating circuit in FIG. 1.
Figure 4:
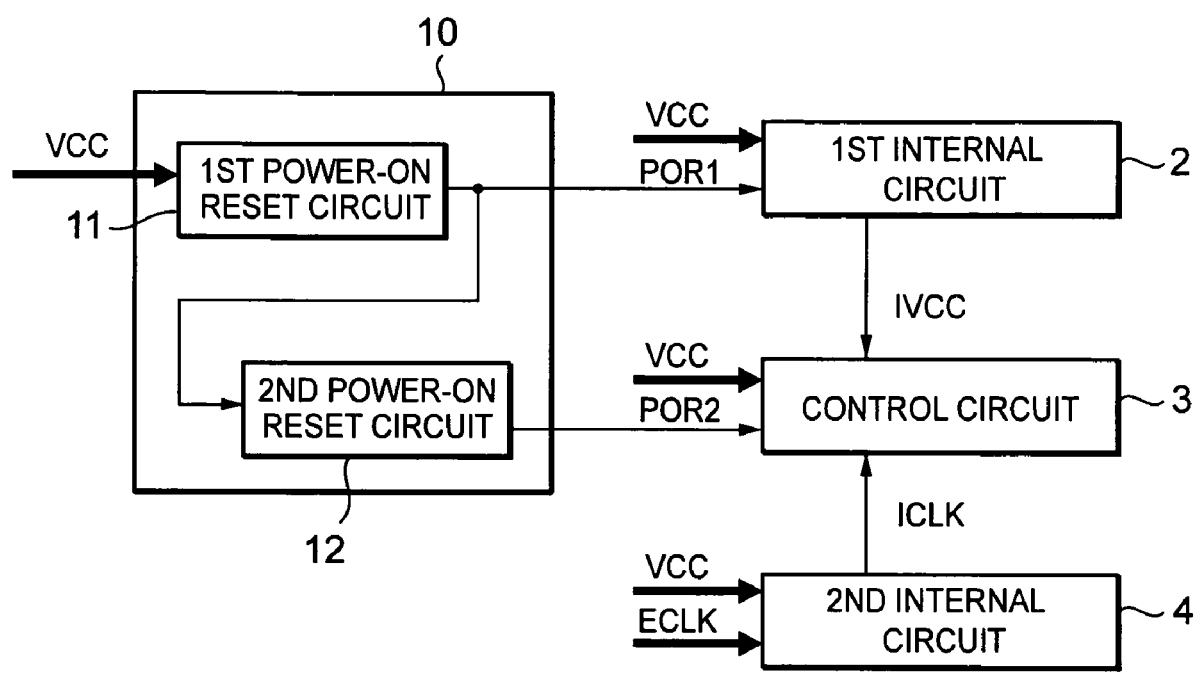
FIG. 4 is a schematic circuit diagram for describing a semiconductor integrated circuit of a semiconductor memory device according to a first preferred embodiment of the present invention.

FIG. 4 is a schematic circuit diagram for describing a semiconductor integrated circuit of a semiconductor memory device according to a first preferred embodiment of the present invention. This semiconductor integrated circuit has a first internal circuit 2, a control circuit 3, a second internal circuit 4 and a power-on reset circuit 10 which all receives a power supply voltage Vcc. For example, an internal power supply voltage generating circuit is used as the first internal circuit 2, and an internal clock generating circuit is used as the second internal circuit 4.

The first internal circuit 2 generates an internal power supply voltage IVcc based on the power supply voltage Vcc. The internal power supply voltage IVcc is supplied to the first internal circuit 2 or the control circuit 3. The first internal circuit 2 needs to be reset by a first power-on reset signal POR1 output from the power-on reset circuit 10, during a start-up process of the semiconductor integrated circuit, that is, when the power supply voltage Vcc is generated. Also, the first internal circuit 2 operates without receiving a signal which is output from the control circuit 3 or the second internal circuit 4.

The control circuit 3 is coupled with the first internal circuit 2. The control circuit 3 receives the power supply voltage Vcc, the internal power supply voltage IVcc and the internal clock signal ICLK output from the second internal circuit 4, and generates a control signal CON in order to control a memory circuit which stores electronic data in the semiconductor memory device. The control circuit 3 needs to be reset by a second power-on reset signal POR2 output from the power-on reset circuit 10 during the start-up process of the semiconductor integrated circuit. Also, the control circuit 3 operates by the internal clock signal ICLK output from the second internal circuit 4.

The second internal circuit 4 is coupled with the control circuit 3 and includes a PLL circuit. The second internal circuit 4 generates the internal clock signal ICLK for the control circuit 3. The internal clock signal ICLK is generated based on the power supply voltage Vcc and a clock signal ECLK which is externally input to the second internal circuit 4. The second internal circuit 4 is not reset when the power supply voltage Vcc is generated. That is, the second internal circuit 4 does not need to be reset during the start-up process of the semiconductor integrated circuit. The internal clock signal ICLK is determined by coincidence between the internal clock signal ICLK and the external clock signal ECLK in the PLL circuit.

The power-on reset circuit 10 includes a first power-on reset circuit 11 and a second power-on reset circuit 12 coupled with each other. The first power-on reset circuit 11 generates the first power-on reset signal POR1 for the first internal circuit 2 when the power supply voltage Vcc is generated. The first power-on reset signal POR1 is also provided to the second power-on reset circuit 12. A rising edge of the first power-on reset signal POR1 resets the first internal circuit 2. The second power-on reset circuit 12 delays the first power-on reset signal POR1 to generate a second power-on reset signal POR2 for the control circuit 3 when the power supply voltage Vcc is generated. That is, the second power-on reset signal POR2 is generated after the rising edge of the first power-on reset signal POR1, and a rising edge of the second power-on reset signal POR2 resets the control circuit 3.

Figure 5:
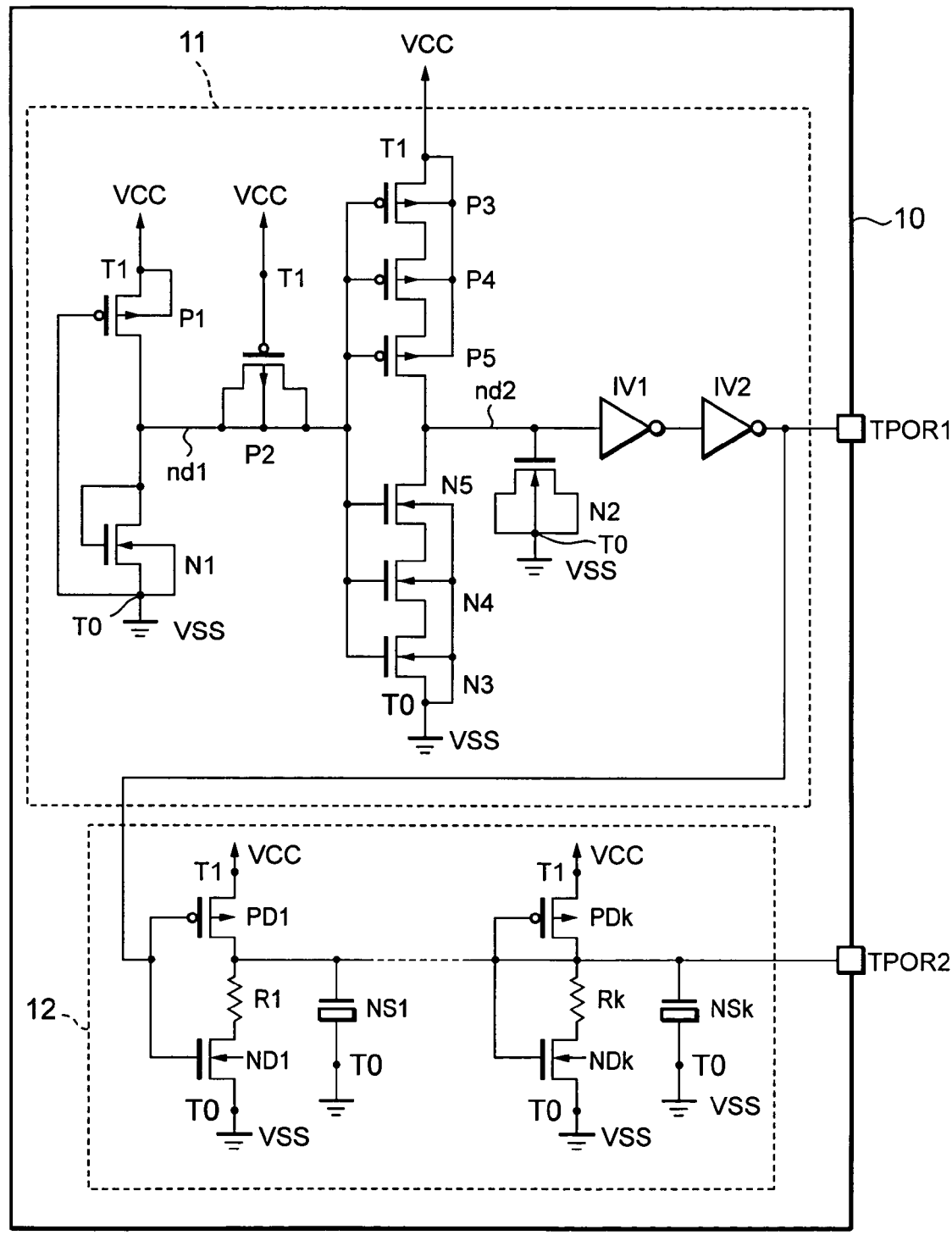
FIG. 5 is a circuit diagram for describing the power-on reset circuit in FIG. 4.

FIG. 5 is a circuit diagram for describing the power-on reset circuit 10 in FIG. 4. The first power-on reset circuit 11 has five P-conductive type MOS transistors (hereinafter referred to as "PMOS transistors") P1–P5, five N-conductive type MOS transistors (hereinafter referred to as "NMOS transistors") N1–N5 and two inverters IV1 and IV2. The PMOS transistor P1 has a source electrode and a bulk coupled with an electrical source terminal T1, a drain electrode coupled with a node nd1 and a gate electrode coupled with a ground source terminal T0. Hereupon, for example, the electrical source terminal T1 receives the power supply voltage Vcc and the ground source terminal T0 receives a ground voltage Vss. The NMOS transistor N1 has a source electrode and a bulk coupled with the ground source terminal T0, a drain electrode and a gate electrode coupled with the node nd1. The PMOS transistor P2 has a gate electrode coupled with the electrical source terminal T1 and a source electrode, a drain electrode and a bulk coupled with the node nd1. The NMOS transistor N2 has a gate electrode coupled with a node nd2 and a source electrode, a drain electrode and a bulk coupled with the ground source terminal T0. Also, all of gate electrodes of the PMOS transistors P3–P5 and the NMOS transistors N3–N5 are coupled with the node nd1. The PMOS transistors P3–P5 have a common bulk coupled with the electrical source terminal T1, and the NMOS transistors N3–N5 have a common bulk coupled with the ground source terminal T0. The PMOS transistor P3 has a source electrode coupled with the electrical source terminal T1 and a drain electrode coupled with a source electrode of the PMOS transistor P4. The PMOS transistor P4 has a drain electrode coupled with a source electrode of the PMOS transistor P5. The PMOS transistor P5 has a drain electrode coupled with a drain electrode of the NMOS transistor N5 through the node nd2.

The NMOS transistor N5 has a source electrode coupled with a drain electrode of the NMOS transistor N4. The NMOS transistor N4 has a source electrode coupled with a drain electrode of the NMOS transistor N3. The NMOS transistor N3 has a source electrode coupled with the ground source terminal T0. The inverter IV1 has an input node coupled with the node nd2 and an output node coupled with an input node of the inverter IV2. The inverter IV2 has an output node coupled with a first output terminal TPOR1 of the power-on reset circuit 10 from which the first power-on reset signal POR1 is output.

The second power-on reset circuit 12 has one or more complementary MOS (hereinafter referred to as "CMOS") circuits. The k-th CMOS circuit (hereinafter "k" is a natural number.) has a PMOS transistor PDk, NMOS transistors NDk and NSk and a resistance element Rk. The PMOS transistor PDk has a source electrode coupled with the electrical source terminal T1, a drain electrode coupled with a drain electrode of the NMOS transistor NDk, and a gate electrode coupled with a gate electrode of the NMOS transistor NDk. The NMOS transistor NDk has a source electrode coupled with the ground source terminal T0. The NMOS transistor NSk has a gate electrode coupled with the drain electrode of the PMOS transistor PDk and source and drain electrodes coupled with the ground source terminal T0. The gate electrodes of the PMOS transistor PDk and the NMOS transistor NDk are coupled with the drain electrode of the preceding PMOS transistor PD(k−1). The drain electrode of the PMOS transistor PDk is coupled with the gate electrodes of the subsequent PMOS transistor PD(k+1) and the subsequent NMOS transistor ND(k+1). The gate electrodes of the initial PMOS transistor PD1 and the NMOS transistor ND1 are coupled with the first output terminal TPOR1 of the power-on reset circuit 10 so as to receive the first power-on reset signal POR1. The drain electrode of the last PMOS transistor PDk is coupled with a second output terminal TPOR2 of the power-on reset circuit 10 from which the second power-on reset signal POR2 is output.

Figure 6A:
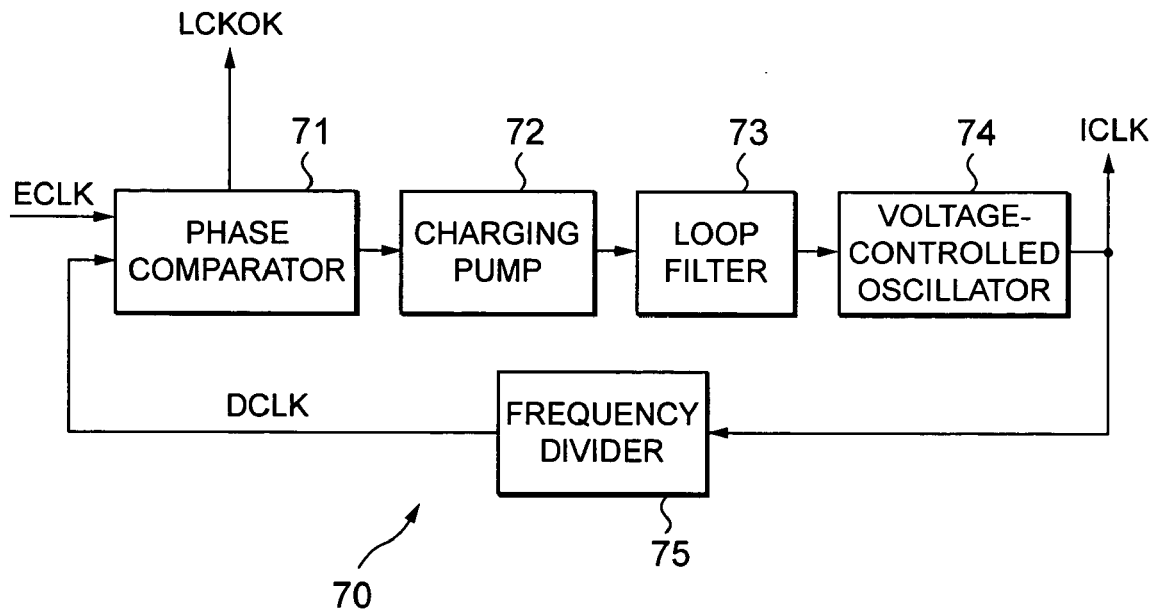
FIG. 6A is a schematic circuit diagram for describing the PLL circuit of the second internal circuit in FIG. 4.

FIG. 6A is a schematic circuit diagram for describing the PLL circuit of the second internal circuit 4 as shown in FIG. 4. The PLL circuit 70 includes a phase comparator 71, a charging pump 72, a loop filter 73, a voltage-controlled oscillator 74 and a frequency divider 75. The phase comparator 71 compares a phase of a divided frequency clock signal DCLK which is output from the frequency divider 75 with a phase of the external clock signal ECLK in order to provide a comparison signal for the charging pump 72. The charging pump 72 provides a current signal based on the comparison signal for the loop filter 73. The loop filter 73 provides a control voltage signal based on the current signal for the voltage-controlled oscillator 74. The voltage-controlled oscillator 74 provides a clock signal which has a frequency based on the control voltage for the frequency divider 75. The frequency divider 75 divides the frequency of the clock signal in order to provide the divided frequency clock signal DCLK for the phase comparator 71.

Figure 6B:
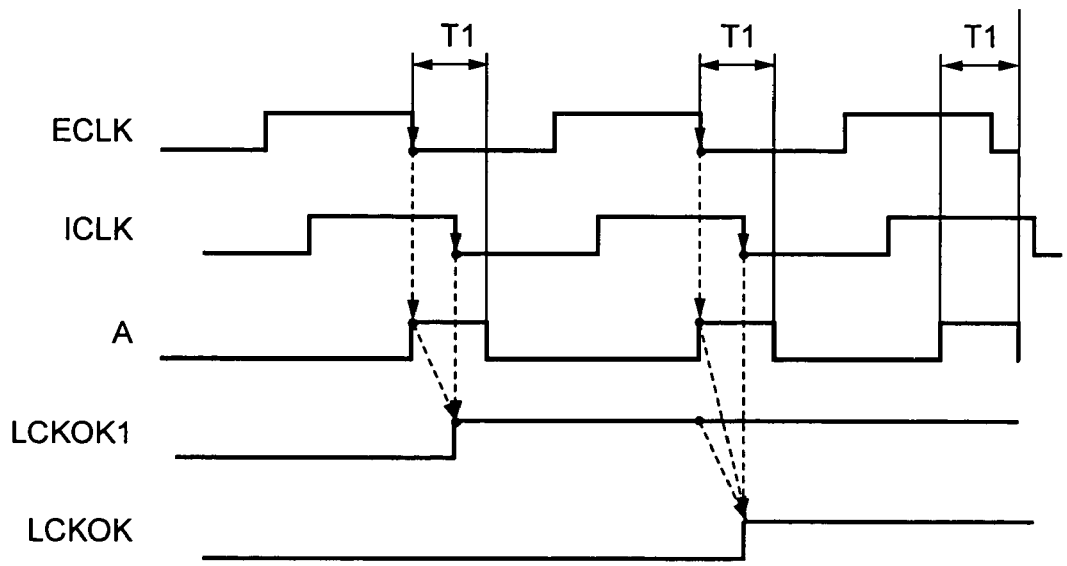
FIG. 6B is a signal waveform diagram for describing the operation of the PLL circuit of the second internal circuit in FIG. 6A.

When the power supply voltage Vcc is generated, the PLL circuit operates so that the divided frequency clock signal DCLK can coincide in the phase with the external clock signal ECLK. After the coincidence between the phases of the divided frequency clock signal DCLK and the external clock signal ECLK, the internal clock signal ICLK output from the voltage-controlled oscillator 74 is determined. After the internal clock signal ICLK is determined, the phase comparator 71 generates a determination signal LCKOK which represents the coincidence between the phases of the divided frequency clock signal DCLK and the external clock signal ECLK. FIG. 6B is a signal waveform diagram for describing the operation of the PLL circuit of the second internal circuit in FIG. 6A. In FIG. 6B, an internal signal A in the phase comparator 71 is a pulse signal which has a pulse width T1 and is generated in response to a trailing edge of the external clock signal ECLK. When the internal clock signal ICLK is turned to the "L" level with the internal signal A kept in the "H" level, a first determination signal LCKOK1 output from the phase comparator 71 is turned to the "H" level. Furthermore, when the internal clock signal ICLK is turned to the "L" level with the first determination signal LCKOK1 and the internal signal A kept in the "H" level, the determination signal LCKOK which is in the "H" level is output from the phase comparator 71. That is, when the internal clock signal ICLK is twice turned to the "L" level with the internal signal A kept in the "H" level, the determination signal LCKOK is generated and the internal clock signal ICLK is determined.

Figure 7:
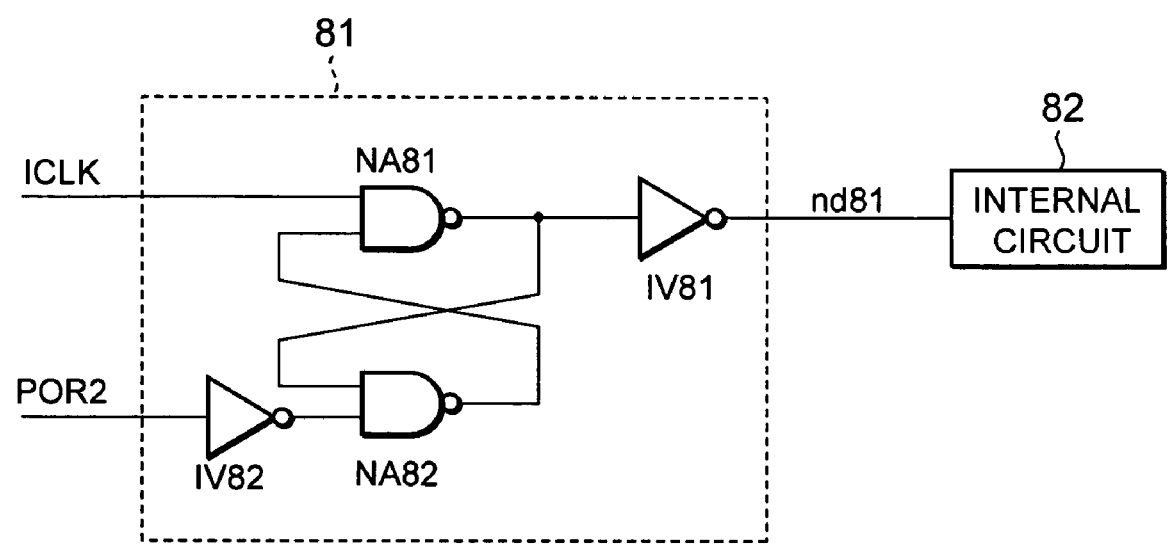
FIG. 7 is a schematic circuit diagram for describing an input set-reset circuit of the control circuit in FIG. 4.

FIG. 7 is a schematic circuit diagram for describing an input set-reset circuit of the control circuit 3 in FIG. 4. The input set-reset circuit 81 has two NAND circuits NA81 and NA 82 and two inverters IV81 and IV82. The NAND circuit NA81 receives the internal clock signal ICLK from the PLL circuit 70 and an output signal from the NAND circuit NA82. The NAND circuit NA82 receives the second power-on reset signal POR2 from the power-on reset circuit 10 through the inverter IV82 and an output signal from the NAND circuit NA81. The output signal from the NAND circuit NA 81 is input to the inverter IV81, and an output signal from the inverter IV81 is input to an internal circuit 82 of the control circuit 3 through a node nd82.

Figure 8:
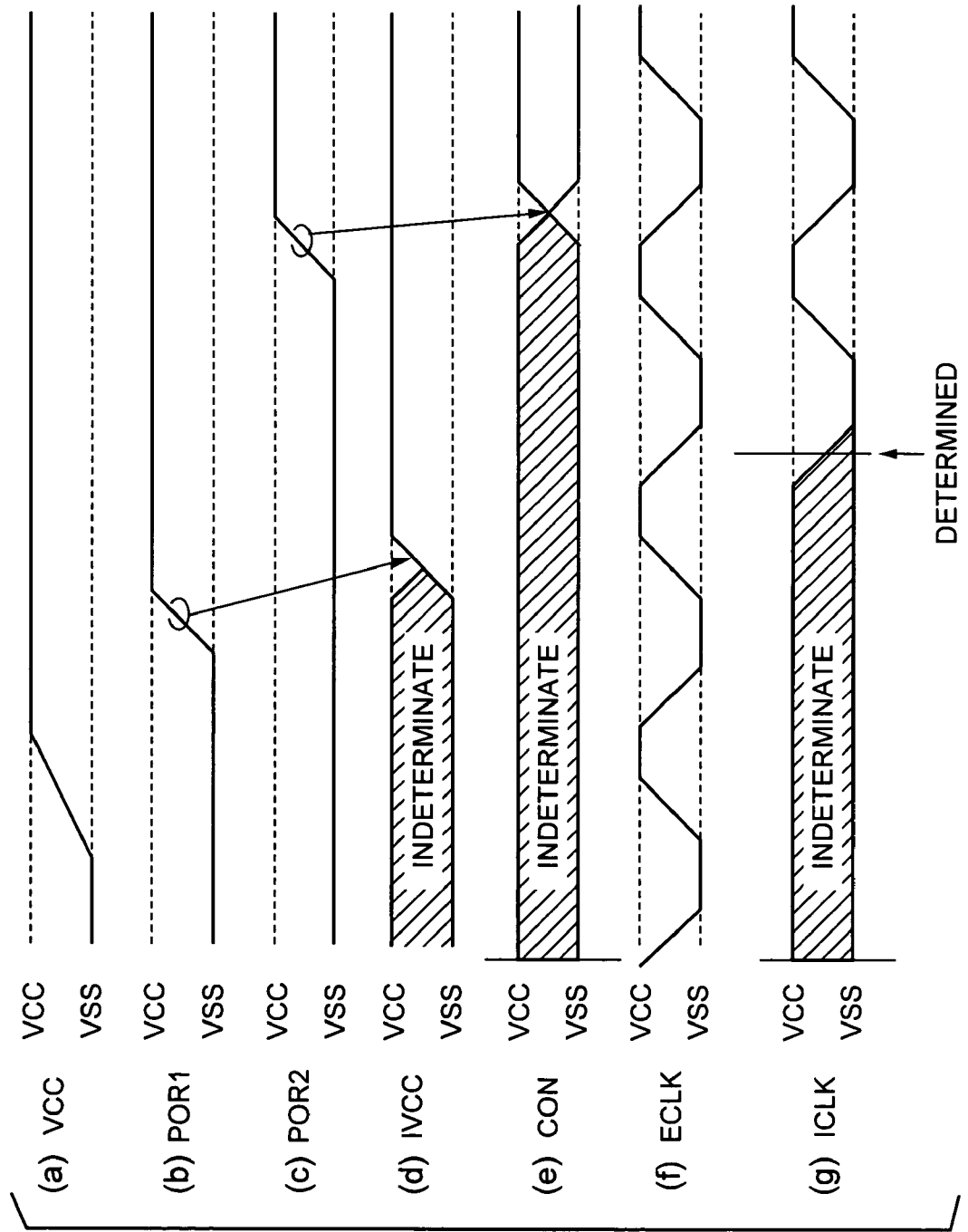
FIGS. 8(a) through 8(e) are signal waveform diagrams for describing a reset operation of the semiconductor integrated circuit in FIG. 4.

The operation of the semiconductor integrated circuit according to the first preferred embodiment of the present invention is described below. FIGS. 8(a) through 8(g) are signal waveform diagrams for describing a reset operation of the semiconductor integrated circuit in FIG. 4. FIG. 8(a) represents a waveform of the power supply voltage Vcc, FIG. 8(b) represents a waveform of the first power-on reset signal POR1, FIG. 8(c) represents a waveform of the second power-on reset signal POR2, FIG. 8(d) represents a waveform of the internal power supply voltage IVcc, FIG. 8(e) represents a waveform of the control signal CON, FIG. 8(f) represents a waveform of the external clock signal ECLK, and FIG. 8(g) represents a waveform of the internal clock signal ICLK.

After the power supply voltage Vcc is generated as shown in FIG. 8(a), the first power-on reset signal POR1 is turned from the "L" level to the "H" level in accordance with the rising edge of the power supply voltage Vcc as shown in FIG. 8(b). The first internal circuit 2 is reset by the rising edge of the first power-on reset signal POR1, and then the internal power supply voltage IVcc, which was indeterminate before the power supply voltage Vcc is generated, is determined by the reset operation of the first internal circuit 2 as shown in FIG. 8(d). Also, after the power supply voltage Vcc is generated, the PLL circuit 70 of the second internal circuit 4 begins to operate in response to the rising edge of the power supply voltage Vcc so that the phase of the divided frequency clock signal DCLK can coincide with the phase of the external clock signal ECLK. Then, the internal clock signal ICLK, which was indeterminate before the power supply voltage Vcc is generated, is determined as shown in FIG. 8(g).

On the other hand, the second power-on reset circuit 12 receives the first power-on reset signal POR1 and generates the second power-on reset signal POR2 for the control circuit 3. That is, the second power-on reset signal POR2 is turned from the "L" level to the "H" level after the generation of the first power-on reset signal POR1 by a predetermined time as shown in FIG. 8(c). The control circuit 3 is reset by the rising edge of the second power-on reset signal POR2, and then the control signal CON, which was indeterminate before the second power-on reset signal POR2 is generated, is determined by the reset operation of the control circuit 3 as shown in FIG. 8(e). Also, when it is necessary that a level on the node nd81 in the input set-reset circuit 81 of the control circuit 3 is kept in the "H" level by default configuration, the second power-on reset signal POR2 has to be turned from the "L" level to the "H" level while the determinate internal clock signal ICLK is kept in the "H" level. Furthermore, in this example, the second power-on reset signal POR2, generated by delaying the first power-on reset signal POR1, is generated after the internal clock signal ICLK is determined. Therefore, the control circuit 3 receives the second power-on reset signal POR2 after receiving the determined internal clock signal ICLK. That is, after the determined internal clock signal ICLK is input to the control circuit 3, the control circuit 3 is reset by the second power-on reset signal POR2. As described above, the power-on reset circuit 10 provides the power-on reset signals (for example, the first and second power-on reset signals) whose rising edges are different than each other, depending on kinds of internal circuits (for example, the first internal circuit 2 and the control circuit 3) to which the power-on reset signals are provided.

According to the first preferred embodiment, the second power-on reset signal is generated by delaying the first power-on reset signal after the internal clock signal is determined, and the control circuit receives the determinate internal clock signal in advance of the second power-on reset signal. That is, the control circuit is reset by the second power-on reset signal after the determinate internal clock signal is input to the control circuit. Therefore, the control circuit can be properly reset when the power supply voltage is generated. Also, since the first internal circuit, which is reset during the start-up process of the semiconductor integrated circuit and does not need to receive the internal clock signal, is reset by the first power-on reset signal which is generated in advance of the second power-on reset signal, the first internal circuit can be reset in advance of the control circuit. Therefore, even if it takes a long time for the first internal circuit to generate the internal power supply voltage, it is restrained that the semiconductor integrated circuit begins to operate with lengthy delays after the power supply voltage begins to be generated.

Figure 9:
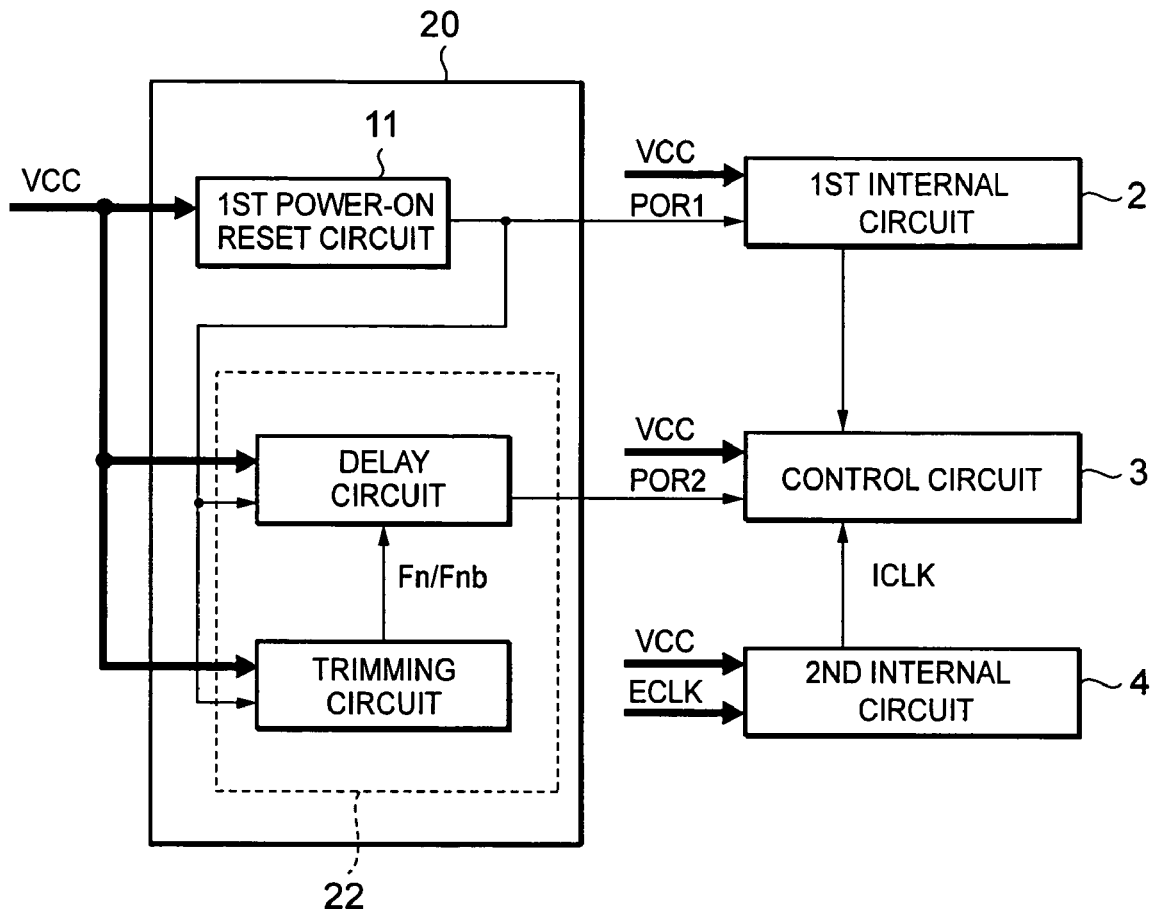
FIG. 9 is a schematic circuit diagram for describing a semiconductor integrated circuit of a semiconductor memory device according to a first preferred embodiment of the present invention.

FIG. 9 is a schematic circuit diagram for describing a semiconductor integrated circuit of a semiconductor memory device according to a second preferred embodiment of the present invention. The semiconductor integrated circuit according to the second preferred embodiment has a power-on reset circuit 20, the first internal circuit 2, the control circuit 3 and the second internal circuit 4. The configuration of the power-on reset circuit 20 in the semiconductor circuit according to the second preferred embodiment is different than that according to the first preferred embodiment. The other configurations of the semiconductor integrated circuit according to the second preferred embodiment are the same as those according to the first preferred embodiment.

Figure 10:
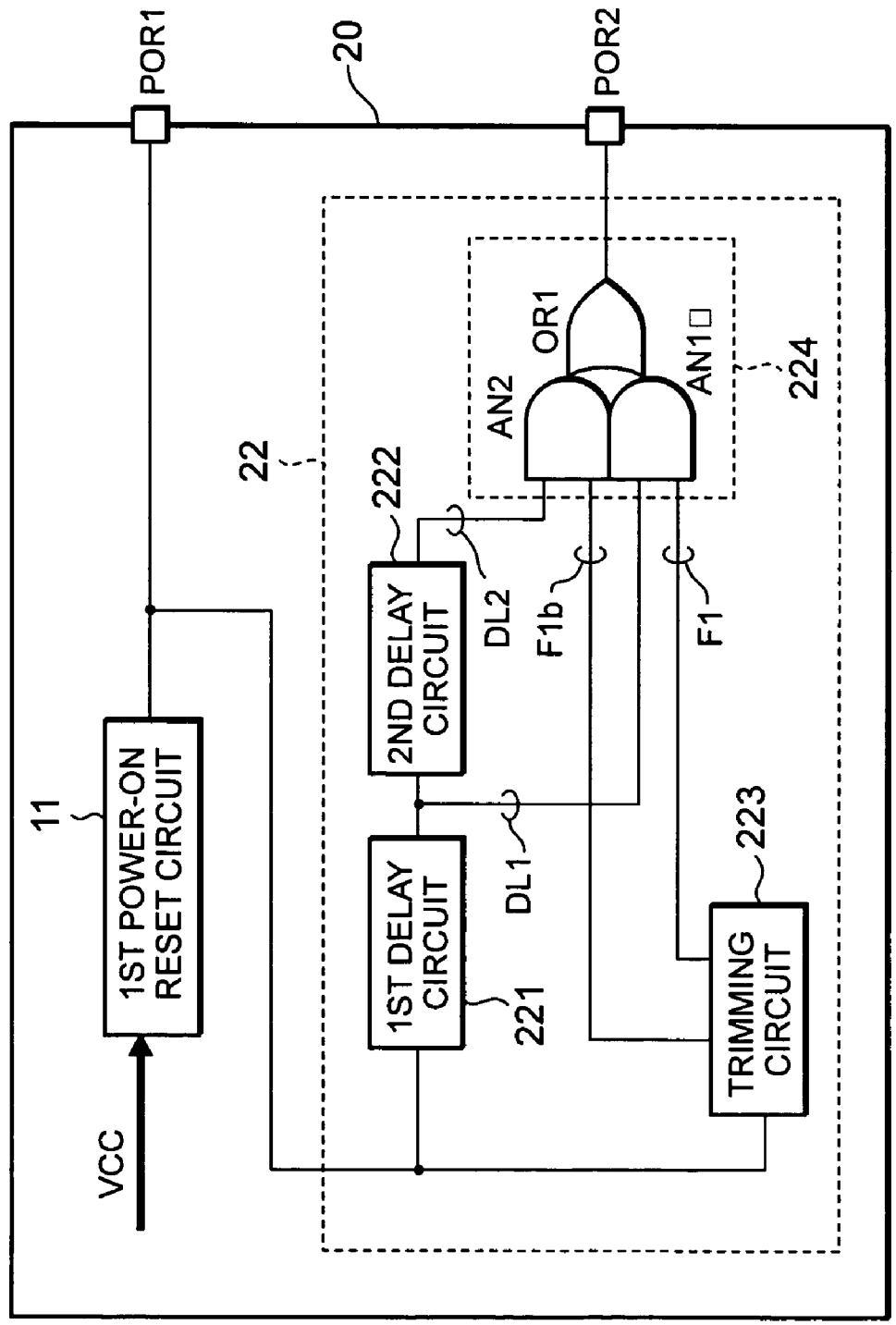
FIG. 10 is a schematic circuit diagram for describing the power-on reset circuit in FIG. 9.

FIG. 10 is a schematic circuit diagram for describing the power-on reset circuit 20 in FIG. 9. The power-on reset circuit 20 includes the first power-on reset circuit 11 as shown in FIG. 5 and a second power-on reset circuit 22 coupled with each other. The first power-on reset circuit 11 generates the first power-on reset signal POR1 for the first internal circuit 2 when the power supply voltage Vcc is generated. The first power-on reset signal POR1 is also provided to the second power-on reset circuit 22. The rising edge of the first power-on reset signal POR1 resets the first internal circuit 2. The second power-on reset circuit 22 delays the first power-on reset signal POR1 to generate a second power-on reset signal POR2 for the control circuit 3 when the power supply voltage Vcc is generated. That is, the second power-on reset signal POR2 is generated after the rising edge of the first power-on reset signal POR1, and a rising edge of the second power-on reset signal POR2 resets the control circuit 3.

The second power-on reset signal 22 has first and second delay circuits 221 and 222, a trimming circuit 223 and a selection circuit 224. Each of the first and second delay circuits 221 and 222 has one or more CMOS circuits as well as the second power-on reset circuit 12 according to the first preferred embodiment. The first and second delay circuits 221 and 222 are coupled in series with each other as shown in FIG. 10. Hereupon, for example, it is assumed that each of the first and second delay circuits 221 and 222 can set the same signal delay time TD. The first delay circuit 221 delays the first power-on reset signal POR1 by the signal delay time TD in order to generate a first delayed signal DL1 for the second delay circuit 222 and the selection circuit 224. The delay circuit 222 delays the first delayed signal DL1 by the signal delay time TD in order to generate a second delayed signal DL2 for the selection circuit 224. That is, the second delayed signal DL2 is generated by twofold of the signal delay time TD after the first power-on reset signal POR1.

Figure 11:
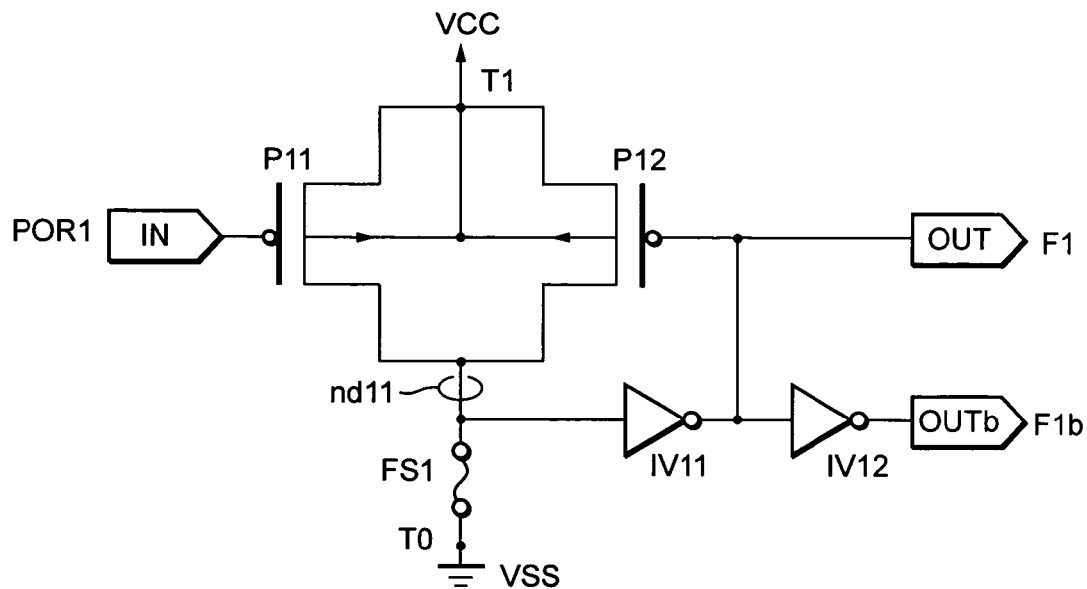
FIG. 11 is a circuit diagram for describing the trimming circuit in FIG. 10.

The trimming circuit 223 is coupled between the first power-on reset circuit 11 and the selection circuit 224. FIG. 11 is a circuit diagram for describing the trimming circuit 223 in FIG. 10. The trimming circuit 223 has two PMOS transistors P11 and P12, a fuse element FS1 and two inverters IV11 and IV12. Source electrodes of the PMOS transistors P11 and P12 are coupled with the electrical source terminal T1, and drain electrodes of the PMOS transistors P11 and P12 are coupled with a node nd11. The fuse element FS1 is coupled between the node nd11 and the ground source terminal T0. The PMOS transistor P11 has a gate electrode coupled with an input terminal IN of the trimming circuit 223, and the PMOS transistor P12 has a gate electrode coupled with an output terminal OUT of the trimming circuit 223. The inverter IV11 has an input terminal coupled with the node nd11 and an output terminal coupled with the output terminal OUT of the trimming circuit 223. The inverter IV12 has an input terminal coupled with the output terminal of the inverter IV11 and an output terminal coupled with an output terminal OUTb of the trimming circuit 223. The input terminal IN of the trimming circuit 223 receives the first power-on reset signal POR1. The trimming circuit 223 generates a trimming signal F1 from the output terminal OUT and an inverted trimming signal F1b from the output terminal OUTb.

The selection 224 has AND circuits AN1 and AN2 and an OR circuit OR1 as sown in FIG. 10. The AND circuit AN1 receives the trimming signal F1 from the trimming circuit 223 and the first delayed signal DL1 from the first delay circuit 221. The AND circuit AN2 receives the inverted trimming signal F1b from the trimming circuit 223 and the second delayed signal DL2 from the second delay circuit 222. The OR circuit OR1 receives output signals from the AND circuits AN1 and AN2 to generate the second power-on reset signal POR2.

The operation of the semiconductor integrated circuit according to the second preferred embodiment of the present invention is described below. The second power-on reset circuit 22 which has the above-mentioned configurations delays the first power-on reset signal POR1 by the preset delay time to generate the second power-on reset signal POR2 which is generated after the timing of the rising edge of the first power-on reset signal POR1. The preset delay time can be determined by the trimming circuit 223.

When the fuse FS1 is not disconnected in the trimming circuit 223, an electrical potential on the node nd11 is kept in the "L" level based on the ground voltage. In these states, the rising edge of the power supply voltage Vcc makes the trimming signal F1 to be turned to the "H" level and makes the inverted trimming signal F1b to be turned to the "L" level. Furthermore, the rising edge of the first power-on reset signal POR1 makes the PMOS transistors P11 and P12 to be turned OFF. Therefore, the first delayed signal DL1 can pass through the AND circuit AN1 and the second delayed signal DL2 can not pass through the AND circuit AN2. That is, the first delayed signal DL1 gets valid and then is output from the selection circuit 224 as the second power-on reset signal POR2. On such an occasion as this, the second power-on reset signal POR2 is generated by the signal delay time TD after the rising edge of the first power-on reset signal POR1.

On the other hand, when the fuse FS1 is disconnected in the trimming circuit 223, the rising edge of the power supply voltage Vcc makes the PMOS transistor P11 to be turned ON and the electrical potential on the node nd11 to be kept in the "H" level. As a result, the trimming signal F1 is turned to the "L" level and the inverted trimming signal F1b is turned to the "H" level. The gate electrode of the PMOS transistor P12 receives the trimming signal F1 which is kept in the "L" level, and then the PMOS transistor 12 is turned ON. The first power-on reset signal POR1 is generated at this moment, the PMOS transistor P11 is turned OFF and the PMOS transistor P12 is kept ON. That is, the electrical potential on the node nd11 is kept in the "H" level by the PMOS transistor 12. Therefore, the first delayed signal DL1 can not pass through the AND circuit AN1 and the second delayed signal DL2 can pass through the AND circuit AN2. That is, the second delayed signal DL2 gets valid and then is output from the selection circuit 224 as the second power-on reset signal POR2. On such an occasion as this, the second power-on reset signal POR2 is generated by twofold of the signal delay time TD after the rising edge of the first power-on reset signal POR1.

According to the second preferred embodiment, the effects according to the first preferred embodiment can be realized. Also, since the second power-on reset circuit has the trimming circuit which previously adjusts the delay time of the second power-on reset signal depending on the connection state of the fuse, variability with respect to the timing at which the internal clock signal is turned to be determinate can be counteracted. Furthermore, in this second preferred embodiment, if the second power-on reset circuit has a plurality of delay circuits which set different signal delay times among them, the timing at which the second power-on reset signal is generated can be flexibly adjusted with a high degree of accuracy. In addition, when the second power-on reset circuit has three or more delay circuits, the second power-on reset circuit may have the same number of trimming circuits as that of the delay circuits and the selection circuit may have the same number of MOS switches as that of the delay circuits.

Figure 12:
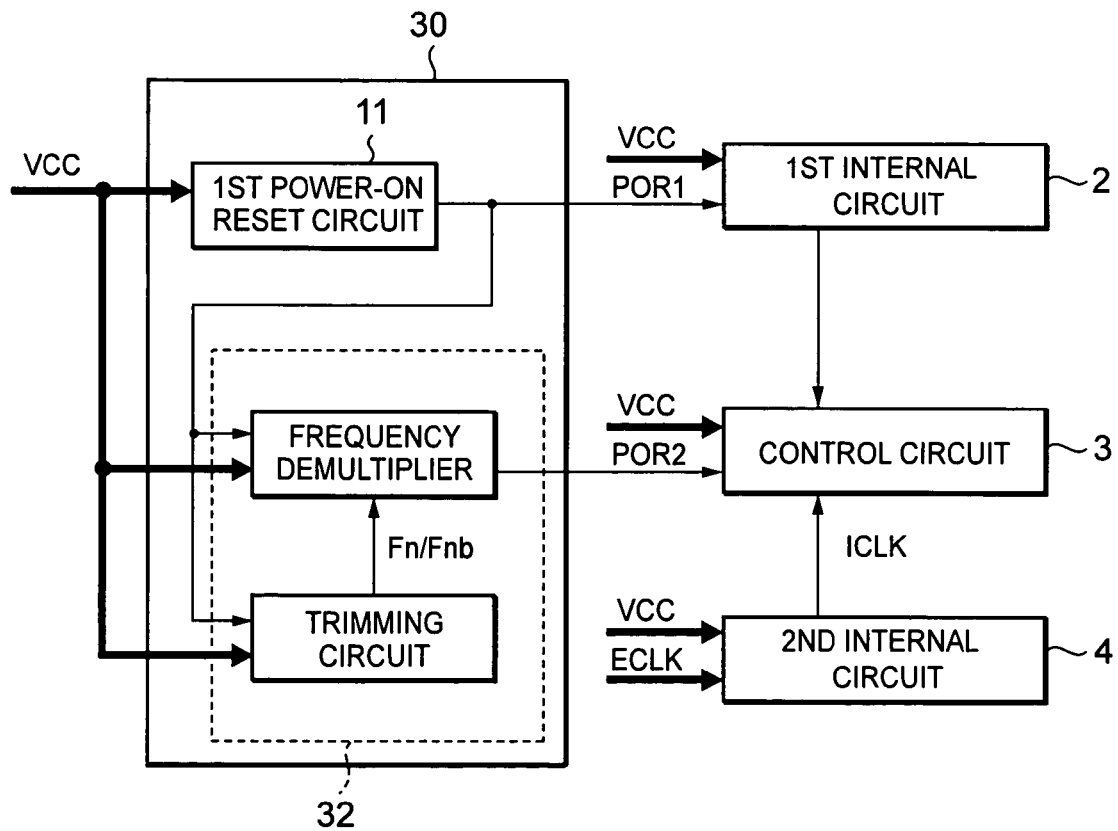
FIG. 12 is a schematic circuit diagram for describing a semiconductor integrated circuit of a semiconductor memory device according to a third preferred embodiment of the present invention.

FIG. 12 is a schematic circuit diagram for describing a semiconductor integrated circuit of a semiconductor memory device according to a third preferred embodiment of the present invention. The semiconductor integrated circuit according to the third preferred embodiment has a power-on reset circuit 30, the first internal circuit 2, the control circuit 3 and the second internal circuit 4. The configuration of the power-on reset circuit 30 in the semiconductor circuit according to the third preferred embodiment is different than that according to the first preferred embodiment. The other configurations of the semiconductor integrated circuit according to the third preferred embodiment are the same as those according to the first preferred embodiment.

Figure 13:
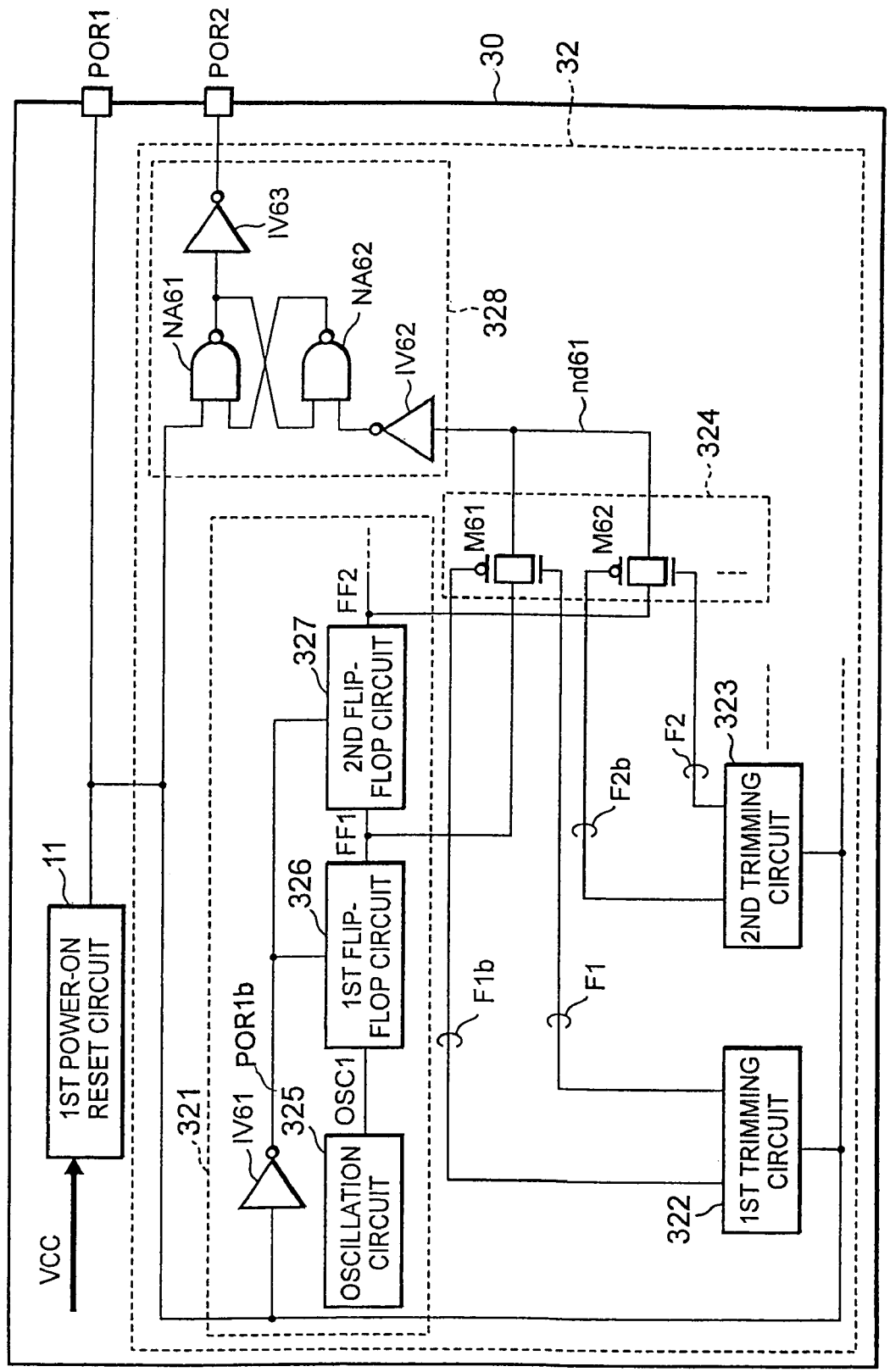
FIG. 13 is a schematic circuit diagram for describing the power-on reset circuit in FIG. 12.

FIG. 13 is a schematic circuit diagram for describing the power-on reset circuit 30 as shown in FIG. 12. The power-on reset circuit 30 includes the first power-on reset circuit 11 as shown in FIG. 5 and a second power-on reset circuit 32 coupled with each other. The first power-on reset circuit 11 generates the first power-on reset signal POR1 for the first internal circuit 2 when the power supply voltage Vcc is generated. The first power-on reset signal POR1 is also provided to the second power-on reset circuit 32. The rising edge of the first power-on reset signal POR1 resets the first internal circuit 2. The second power-on reset circuit 32 delays the first power-on reset signal POR1 to generate a second power-on reset signal POR2 for the control circuit 3 when the power supply voltage Vcc is generated. That is, the second power-on reset signal POR2 is generated after the rising edge of the first power-on reset signal POR1, and a rising edge of the second power-on reset signal POR2 resets the control circuit 3.

The second power-on reset signal 32 has a frequency demultiplier 321, first and second trimming circuits 322 and 323, a selection circuit 324 and an output latch circuit 328 as shown in FIG. 13. Each of the first and second trimming circuits 322 and 323 has a similar configuration as that of the trimming circuit 223 according to the second preferred embodiment as shown in FIG. 11. The first trimming circuit 322 outputs a first trimming signal F1 from its output terminal and a first inverted trimming signal F1b from its output terminal OUTb. The first trimming circuit 323 outputs a second trimming signal F2 from its output terminal OUT and a second inverted trimming signal F2b from its output terminal OUTb.

The frequency demultiplier 321 includes an oscillation circuit 325, first and second flip-flop circuits 326 and 327 and an inverter IV61. The inverter IV61 generates an inverted signal POR1b of the first power-on reset signal POR1 for the first and second flip-flop circuits 326 and 327. The oscillation circuit 325 and the first and second flip-flop circuits 327 are coupled in series with one another. The first flip-flop circuit 326 receives an oscillation signal OSC1 from the oscillation circuit 325 and makes the oscillation signal OSC1 lower by a half in order to generate a first delayed signal FF1 for the second flip-flop circuit 326 and the output latch circuit 328. Furthermore, the flip-flop circuit 327 makes the first delayed signal FF1 lower by a half in order to generate a second delayed signal FF2 for the output latch circuit 328. The first and second delayed signals FF1 and FF2 are sub power-on reset signals which is used to generate the second power-on reset signal POR2.

Figure 14:
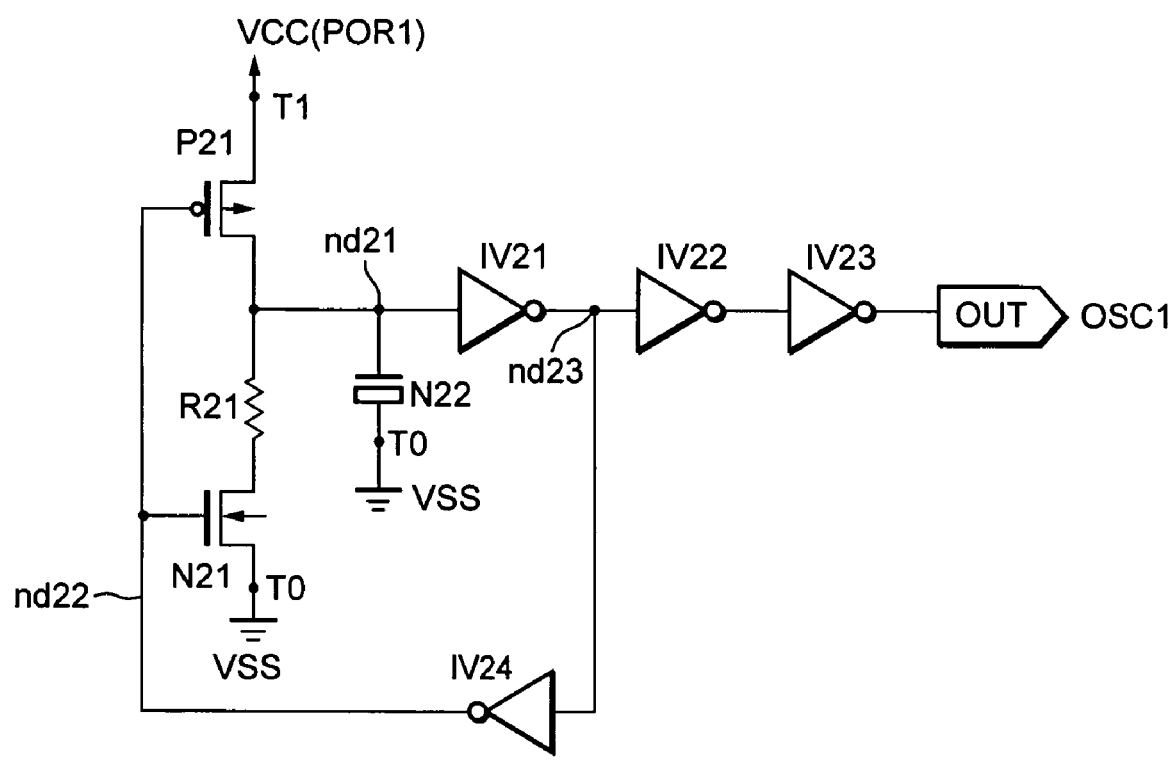
FIG. 14 is a circuit diagram for describing the oscillation circuit in FIG. 13.

FIG. 14 is a circuit diagram for describing the oscillation circuit 325 in FIG. 13. The oscillation circuit 325 has a PMOS transistor P21, NMOS transistors N21 and N22, inverters IV21–IV24 and a resistance element R21. The PMOS transistor P21 has a source electrode coupled with the electrical source terminal T1, a drain electrode coupled with a node nd21 and a gate electrode coupled with a node nd22. The NMOS transistor N21 has a source electrode coupled with the ground source terminal T0, a drain electrode coupled with the node nd21 through the resistance element R21 and a gate electrode coupled with the node nd22. The NMOS transistor N22 has a gate electrode coupled with the node nd21 and source and drain electrodes coupled with the ground source terminal T0. The inverter IV21 has an input terminal coupled with the node nd21 and an output terminal coupled with a node nd23. The inverter IV24 has an input terminal coupled with the node nd23 and an output terminal coupled with the node nd22. The inverter IV22 has an input terminal coupled with the node nd23 and an output terminal coupled with an input terminal of the inverter IV23. The inverter IV23 has an output terminal coupled with an output terminal of the oscillation circuit OSC. The oscillation signal OSC1 is output from the output terminal of the oscillation circuit OSC. After the power supply voltage Vcc is generated, the oscillation circuit 325 which has the above-mentioned configurations begins oscillating operation at a predetermined frequency and then outputs the oscillation signal OSC1 which has the predetermined frequency. In addition, the oscillation circuit 325 may begin the oscillating operation after the first power-on reset signal POR1 is generated. Therefore, the first power-on reset signal POR1 may be provided to the source electrode of the PMOS transistor P21 instead of the power supply voltage Vcc.

Figure 15A:
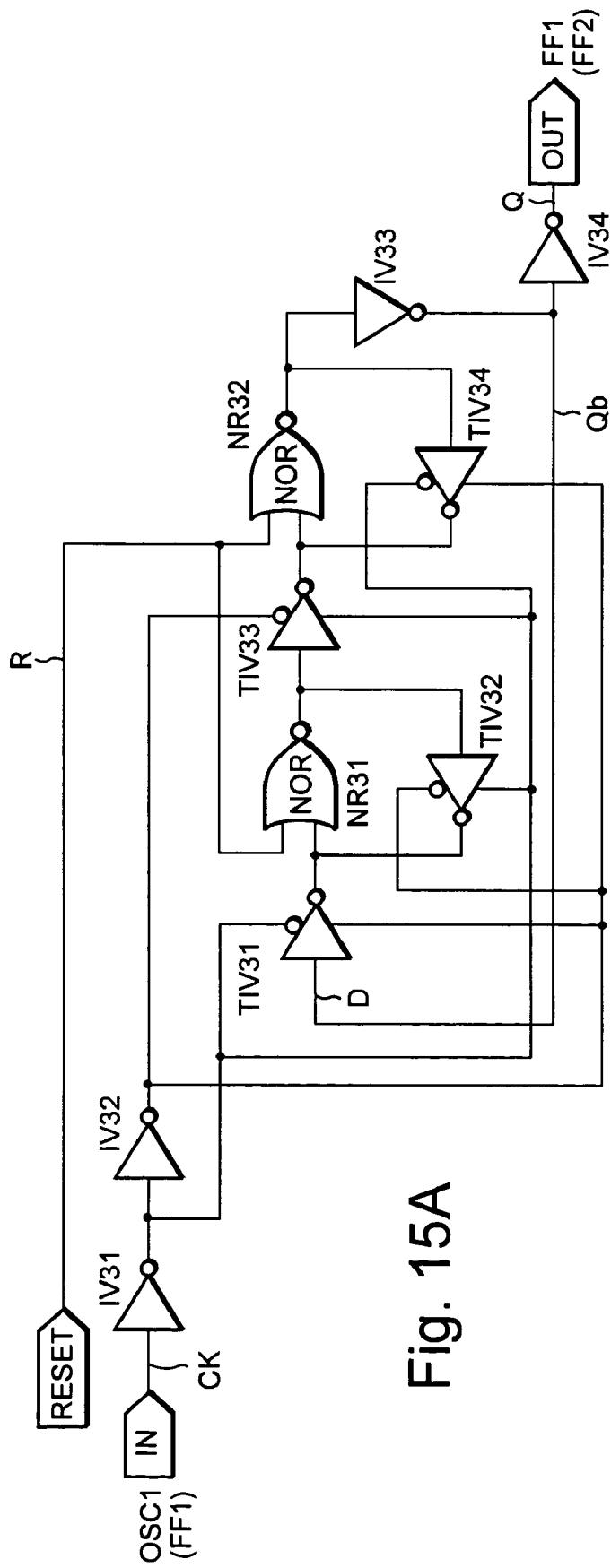
FIG. 15A is a circuit diagram for describing the first or second flip-flop circuit in FIG. 13.
Figure 15B:
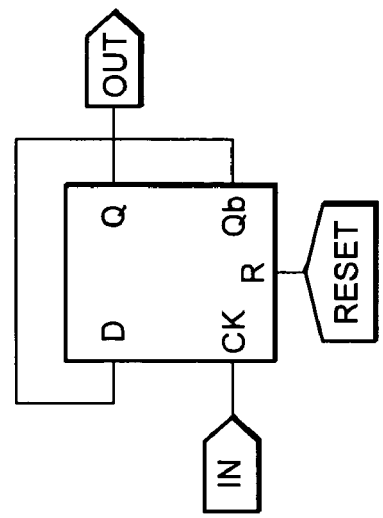
FIG. 15B is a schematic diagram for describing the first or second flip-flop circuit in FIG. 15A.

The first and second flip-flop circuits 326 and 327 have a similar circuit configuration each other. FIG. 15A is a circuit diagram for describing the first or second flip-flop circuit 326 or 327. FIG. 15B is a schematic diagram for describing the first or second flip-flop circuit 326 or 327 in FIG. 15A. Hereinafter, the configurations of the first flip-flop circuit 326 are described below as a representative example. The first flip-flop circuit 326 is a D-type flip-flop circuit which includes four inverters IV31–IV34, four tri-state inverters TIV31–TIV34 and two NOR circuits NR31 and NR32. Each of the tri-state inverter TIV31–TIV34 has first and second control terminals. When the first control terminal receives a signal which is in the "L" level and the second control terminal receives a signal which is in the "H" level, the tri-state inverter generates an inverted signal of an input signal. On the contrary, when the first control terminal receives the signal which is in the "H" level and the second control terminal receives the signal which is in the "L" level, the tri-state inverter makes its output terminal to be in high impedance state.

In the first flip-flop circuit as shown in FIG. 15A, the inverter IV 31 has an input terminal coupled with an clock input terminal CK of the first flip-flop circuit 326. The inverter IV31 also has an output terminal coupled with an input terminal of the inverter IV32, the first control terminals of the tri-state inverters TIV31 and TIV34, and the second control terminals of the tri-state inverters TIV32 and TIV33. The inverter IV32 has an output terminal coupled with the second control terminals of the tri-state inverters TIV31 and TIV34 and the first control terminals of the tri-state inverters TIV32 and TIV33.

The NOR circuit NR31 has a first input terminal coupled with a reset input terminal R of the first flip-flop circuit 326, a second input terminal coupled with the output terminals of the tri-state inverter TIV31 and TIV32 and an output terminal coupled with input terminals of the tri-state inverter TIV32 and TIV33. The NOR circuit NR32 has a first input terminal coupled with the reset input terminal R, a second input terminal coupled with output terminals of the tri-state inverters TIV33 and TIV34 and an output terminal coupled with input terminals of the inverter IV33 and the tri-state inverter TIV34. The inverter IV33 has an output terminal coupled with input terminals of the inverter IV34 and the tri-state inverter TIV31. The inverter IV34 has an output terminal coupled with an output terminal Q of the first flip-flop circuit 326. The output terminal of the inverter IV33 functions as an output terminal Qb of the first flip-flop circuit 326, and the input terminal of the tri-state inverter TIV31 functions as a data input terminal D of the first flip-flop circuit 326.

The clock input terminal CK of the first flip-flop circuit 326 receives the oscillation signal OSC1 from the oscillation circuit 325, and then the first delayed signal FF1 is generated from the output terminal Q of the first flip-flop circuit 326. The first delayed signal FF1 has a half of a frequency of the oscillation signal OSC1. The input terminal CK of the second flip-flop circuit 327 receives the first delayed signal FF1, and then the second delayed signal FF2 is generated from the output terminal Q of the second flip-flop circuit 327. The second delayed signal has a half of a frequency of the first delayed signal FF1, that is, a quarter of the frequency of the oscillation signal OSC1. Also, the reset input terminals of the first and second flip-flop circuits 326 and 327 respectively receive the inverted signal POR1b of the first power-on reset signal POR1.

The selection circuit 324 has first and second MOS switches M61 and M62. Each of the first and second MOS switches M61 and M62 has PMOS and NMOS transistors coupled in parallel with each other. The first MOS switch M61 is coupled between the first flip-flop circuit 326 and a node nd61 so as to receive the first delayed signal FF1. The NMOS transistor of the first MOS switch M61 has a gate electrode which receives the first trimming signal F1 from the first trimming circuit 322, and the PMOS transistor of the first MOS switch M61 has a gate electrode which receives the first inverted trimming signal F1b from the first trimming circuit 322. The second MOS switch M62 is coupled between the second flip-flop circuit 327 and the node nd61 so as to receive the second delayed signal FF2. The NMOS transistor of the second MOS switch M62 has a gate electrode which receives the second trimming signal F2 from the second trimming circuit 323, and the PMOS transistor of the second MOS switch M62 has a gate electrode which receives the second inverted trimming signal F2b from the second trimming circuit 323.

The output latch circuit 328 has two NAND circuits NA61 and NA62 and two inverters IV62 and IV63. The NAND circuit NA61 receives the first power-on reset signal POR1 from the first power-on reset circuit 11 and an output signal from the NAND circuit NA62 and then provides an output signal to the inverter IV63. The inverter IV62 receives either the first delayed signal FF1 or the second delayed signal FF2 through the node nd61. The NAND circuit NA62 receives an output signal from the inverter IV62 and the output signal from the NAND circuit NA61. The inverter IV63 generates an output signal as the second power-on reset signal POR2.

The operation of the second power-on reset circuit 32 according to the second preferred embodiment of the present invention is described below. The second power-on reset circuit 32 which has the above-mentioned configurations delays the first power-on reset signal POR1 by the preset delay time to generate the second power-on reset signal POR2 which is generated after the timing of the rising edge of the first power-on reset signal POR1. The preset delay time can be determined mainly by the frequency demultiplier 321 and the output latch circuit 328.

When the fuse FS1 of the first trimming circuit 322 is not disconnected and the fuse FS1 of the second trimming circuit 323 is disconnected, the first trimming signal F1 is turned to the "H" level, the first inverted trimming signal F1b is turned to be the "L" level, the second trimming signal F2 is turned to the "L" level and the second inverted trimming signal F2b is turned to be the "H" level by the rising edge of the power supply voltage Vcc. Then, the first MOS switch M61 is turned ON and the second MOS switch M62 is turned OFF. Therefore, the first delayed signal FF1 from the first flip-flop circuit 326 is transmitted to the node nd61 through the first MOS switch M61. On the other hand, when the fuse FS1 of the first trimming circuit 322 is disconnected and the fuse FS1 of the second trimming circuit 323 is not disconnected, the first trimming signal F1 is turned to the "L" level, the first inverted trimming signal F1b is turned to be the "H" level, the second trimming signal F2 is turned to the "H" level and the second inverted trimming signal F2b is turned to be the "L" level by the rising edge of the power supply voltage Vcc. Then, the first MOS switch M61 is turned OFF and the second MOS switch M62 is turned ON. Therefore, the second delayed signal FF2 from the second flip-flop circuit 327 is transmitted to the node nd61 through the first MOS switch M62.

Next, the operation of the output latch circuit 328 before and after the generation of the first or second delayed signal FF1 or FF2 is described below. The electrical potential on the node nd61 is in the "L" level before the first or second delayed signal FF1 or FF2 is generated for the first time and after the power supply voltage Vcc begins to be generated. Then, the inverter IV62 outputs a signal which is in the "H" level. Also, before the first power-on reset signal POR1 is generated and after the power supply voltage Vcc is generated, that is, while the first power-on reset signal POR1 is kept in the "L" level, the NAND circuit NA61 outputs a signal which is kept in the "H" level and the NAND circuit NA62 outputs a signal which is kept in the "L" level. Therefore, the inverter IV63 outputs the second power-on reset signal POR2 which is kept in the "L" level. Even after the rising edge of the first power-on reset signal POR1, the output signal from the NAND circuit NA61 is kept in the "H" level because the output signal from the NAND circuit NA 62 is kept in the "L" level. That is, before the first or second delayed signal FF1 or FF2 is generated, the second power-on reset signal POR2 is kept in the "L" level even after the rising edge of the first power-on reset signal POR1. On the other hand, the operation of the output latch circuit 328 after the generation of the first or second delayed signal FF1 or FF2 is described below. When the first or second delayed signal FF1 or FF2 is generated for the first time after the rising edge of the first power-on reset signal POR1, the NAND circuit NA62 receives the signal which is turned to the "L" level from the inverter IV62. Then, the output signal from the NAND circuit NA62 is turned from the "L" level to the "H" level regardless of the output signal from the NAND circuit NA61. Therefore, the output signal from the NAND circuit NA61 is turned from the "H" level to the "L" level. As a result, the inverter IV63 outputs the second power-on reset signal POR2 which is turned from the "L" level to the "H" level. And then, even after the first or second delayed signal FF1 or FF2 is turned to the "L" level, the output signal from the NAND circuit NA62 is kept in the "H" level and the output signal from the NAND circuit NA61 is kept in the "L" level. Therefore, the second power-on reset signal POR2 is consecutively kept in the "H" level.

Figure 16:
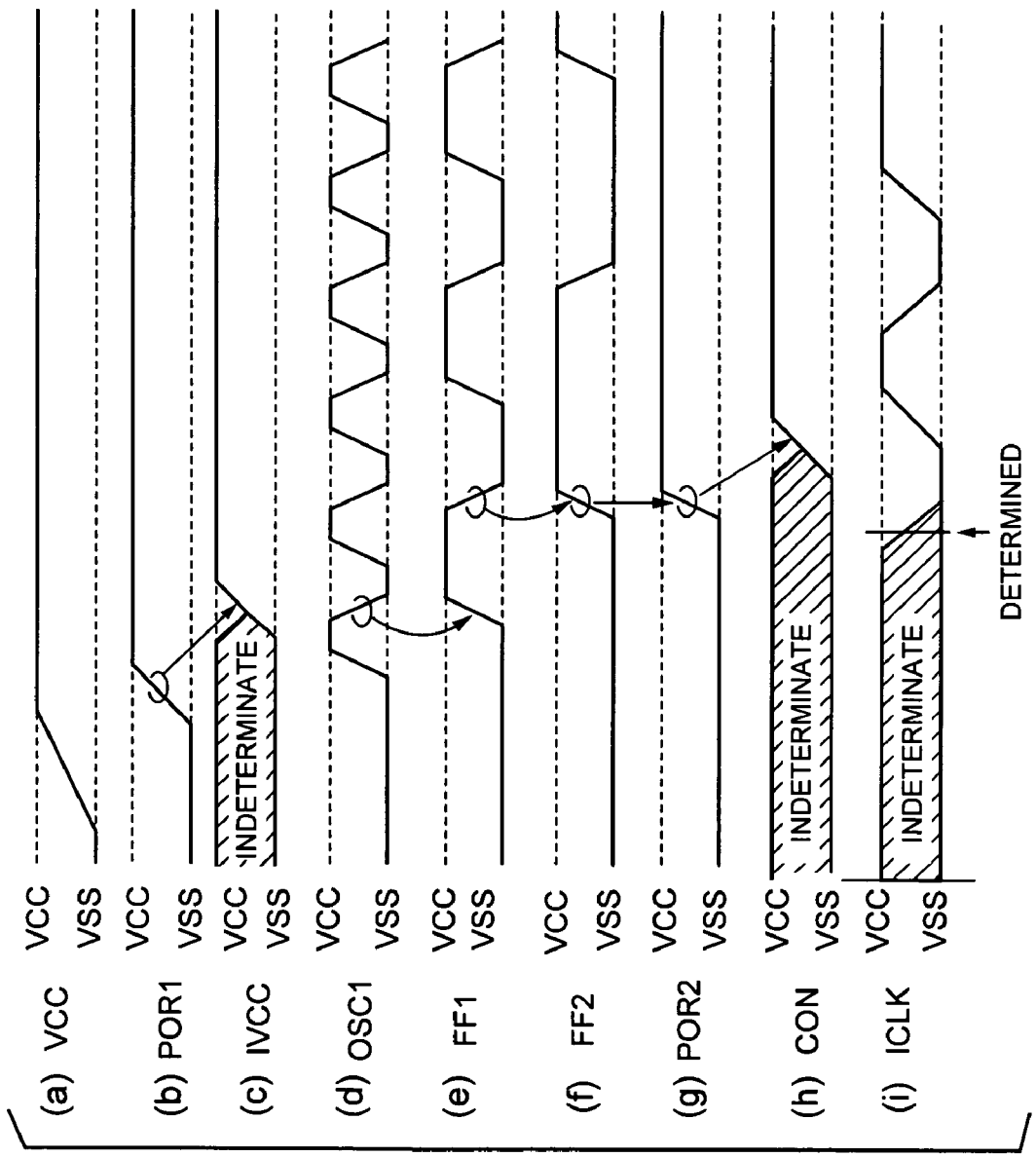
FIGS. 16(*a*) through 16(*i*) are signal waveform diagrams for describing a reset operation of the semiconductor integrated circuit in FIG. 12.

Hereinafter, the operation of the semiconductor integrated circuit according to the third preferred embodiment of the present invention is described below. FIGS. 16(a) through 16(i) are signal waveform diagrams for describing a reset operation of the semiconductor integrated circuit in FIG. 12. FIG. 16(a) represents a waveform of the power supply voltage Vcc, FIG. 16(b) represents a waveform of the first power-on reset signal POR1, FIG. 16(c) represents a waveform of the internal power supply voltage IVcc, FIG. 16(d) represents a waveform of the oscillation signal OSC1 output from the oscillation circuit 325, FIG. 16(e) represents a waveform of the first delayed signal FF1 output from the first flip-flop circuit 326, FIG. 16(f) represents a waveform of the second delayed signal FF2 output from the second flip-flop circuit 327, FIG. 16(g) represents a waveform of the second power-on reset signal POR2, FIG. 16(h) represents a waveform of the control signal CON, and FIG. 16(i) represents a waveform of the internal clock signal ICLK. In this example, as shown in FIG. 16, the second power-on reset signal POR2 is generated with based on the second delayed signal FF2 which has a quarter of the frequency of the oscillation signal OSC1.

After the power supply voltage Vcc is generated as shown in FIG. 16(a), the first power-on reset signal POR1 is turned from the "L" level to the "H" level in accordance with the rising edge of the power supply voltage Vcc as shown in FIG. 16(b). The first internal circuit 2 is reset by the rising edge of the first power-on reset signal POR1, and then the internal power supply voltage IVcc, which was indeterminate before the power supply voltage Vcc is generated, is determined by the reset operation of the first internal circuit 2 as shown in FIG. 16(c). Also, after the power supply voltage Vcc is generated, the PLL circuit 70 of the second internal circuit 4 begins to operate in response to the rising edge of the power supply voltage Vcc so that the phase of the divided frequency clock signal DCLK can coincide with the phase of the external clock signal ECLK. Then, the internal clock signal ICLK, which was indeterminate before the power supply voltage Vcc is generated, is determined as shown in FIG. 16(i).

On the other hand, in the frequency demultiplier of the second power-on reset circuit 32, the oscillation circuit 325 begins to operate in order to generate the oscillation signal OSC1 after the rising edge of the power supply voltage Vcc as shown in FIG. 16(d). Then, the first flip-flop circuit 326 generates the first delayed signal FF1, which has a half of the frequency of the oscillation signal OSC1, in response to the first falling edge of the oscillation signal OSC1 as shown in FIG. 16(e). Furthermore, the second flip-flop circuit 327 generates the second delayed signal FF2, which has a half of the frequency of the first delayed signal FF1, in response to the first falling edge of the first delayed signal FF1 as shown in FIG. 16(f). The second delayed signal FF2 which has a quarter of the frequency of the oscillation signal OSC1 is transmitted to the output latch circuit 328 through the selection circuit 324. The first rising edge of the second delayed signal FF2 induces the second power-on reset signal POR2 to be turned from the "L" level to the "H" level after the generation of the first power-on reset signal POR1 as shown in FIG. 16(g). The control circuit 3 is reset by the rising edge of the second power-on reset signal POR2, and then the control signal CON, which was indeterminate before the second power-on reset signal POR2 is generated, is determined by the reset operation of the control circuit 3 as shown in FIG. 16(h).

According to the third preferred embodiment, the effects according to the first and second preferred embodiments can be realized. Also, since the delay circuit which mainly consists of a resistance element induces an increased area of the delay circuit, it is hard to realize the delay time on the millisecond time scale using a plurality of the delay circuits. However, according to the third preferred embodiment, the second power-on reset signal is generated based on the oscillation signal from the frequency demultiplier after the generation of the first power-on reset signal. Therefore, the delay time on the millisecond time scale can be easily realized without increasing the area of the semiconductor integrated circuit. Alternatively, the second power-on reset signal may be generated by just adding logical circuits to a frequency divider such as a self-refresh circuit of the prior art in order to suppress the area of the semiconductor integrated circuit.

Figure 17:
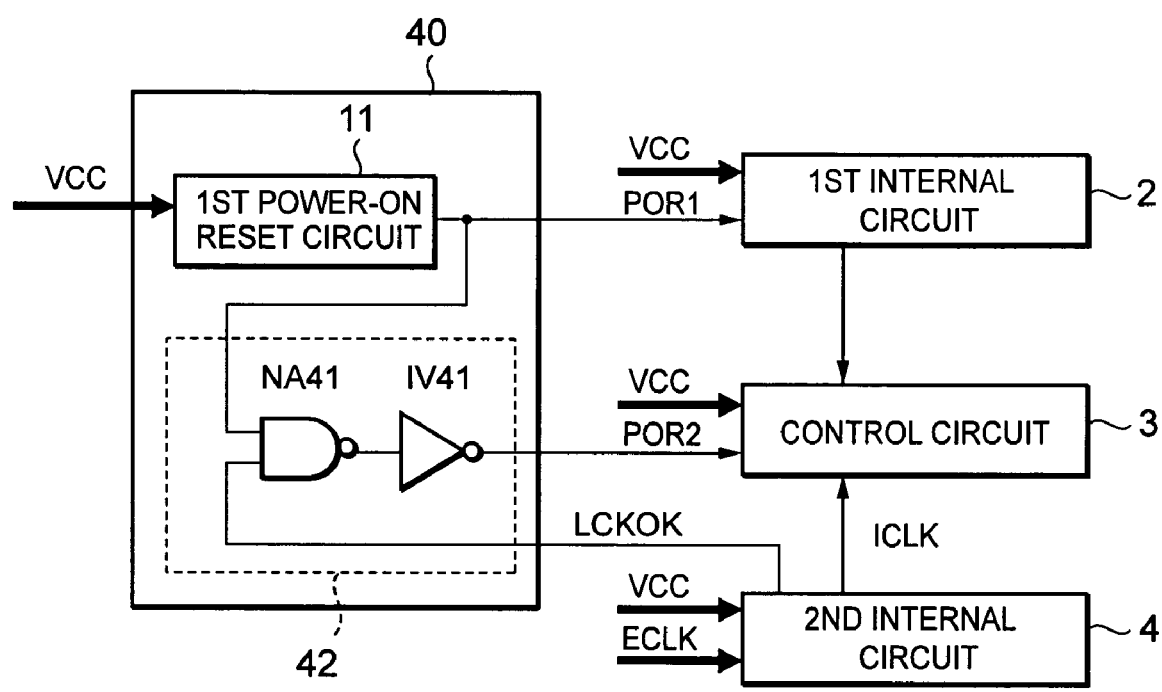
FIG. 17 is a schematic circuit diagram for describing a semiconductor integrated circuit of a semiconductor memory device according to a fourth preferred embodiment of the present invention.

FIG. 17 is a schematic circuit diagram for describing a semiconductor integrated circuit of a semiconductor memory device according to a fourth preferred embodiment of the present invention. The semiconductor integrated circuit according to the fourth preferred embodiment has a power-on reset circuit 40, the first internal circuit 2, the control circuit 3 and the second internal circuit 4. The configuration of the power-on reset circuit 40 in the semiconductor circuit according to the fourth preferred embodiment is different than that according to the first to third preferred embodiments. The other configurations of the semiconductor integrated circuit according to the fourth preferred embodiment are the same as those according to the first to third preferred embodiments.

The power-on reset circuit 40 according to the fourth preferred embodiment includes the first power-on reset circuit 11 as shown in FIG. 5 and a second power-on reset circuit 42 coupled with each other. The first power-on reset circuit 11 generates the first power-on reset signal POR1 for the first internal circuit 2 when the power supply voltage Vcc is generated. The first power-on reset signal POR1 is also provided to the second power-on reset circuit 42. The rising edge of the first power-on reset signal POR1 resets the first internal circuit 2. The second power-on reset circuit 42 delays the first power-on reset signal POR1 to generate a second power-on reset signal POR2 for the control circuit 3 when the power supply voltage Vcc is generated. That is, the second power-on reset signal POR2 generated after the rising edge of the first power-on reset signal POR1, and a rising edge of the second power-on reset signal POR2 resets the control circuit 3.

The second power-on reset signal 42 has a NAND circuit NA41 and an inverter IV41 as shown in FIG. 17. The NAND circuit NA41 is coupled with the first power-on reset circuit 11 which is shown in FIG. 5 and the second internal circuit 4 which is shown in FIG. 6A so as to receive the first power-on reset signal POR1 and the determination signal LCKOK. The determination signal LCKOK is turned from the "L" level to the "H" level, based on the coincidence between the phases of the divided frequency clock signal DCLK and the external clock signal ECLK. The inverter IV41 is coupled in series with the NAND circuit NA41 so as to receive a logical signal output from the NAND circuit NA41. The inverter IV41 generates the second power-on reset signal POR2 for the control circuit 3. The second power-on reset circuit 42 which has the above-mentioned configurations generates the second power-on reset signal POR2 in response to the rising edge of the determination signal LCKOK after the generation of the first power-on reset signal POR.

Figure 18:
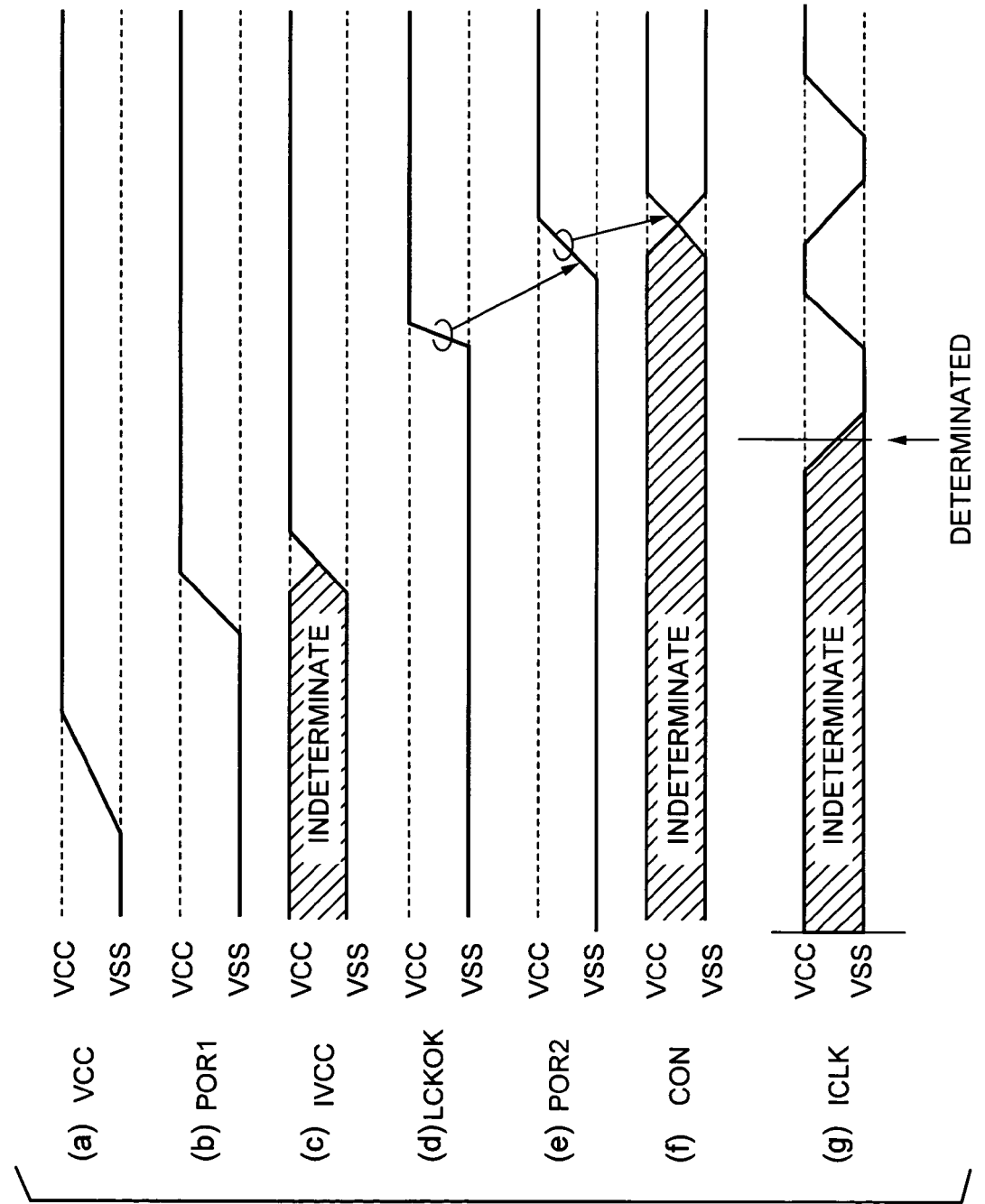
FIG. 18 is a signal waveform diagram for describing a reset operation of the semiconductor integrated circuit in FIG. 17.

The operation of the semiconductor integrated circuit according to the fourth preferred embodiment of the present invention is described below. FIGS. 18(a) through 18(g) are signal waveform diagrams for describing a reset operation of the semiconductor integrated circuit in FIG. 17. FIG. 18(a) represents a waveform of the power supply voltage Vcc, FIG. 18(b) represents a waveform of the first power-on reset signal POR1, FIG. 18(c) represents a waveform of the internal power supply voltage IVcc, FIG. 18(d) represents a waveform of the determination signal LCKOK, FIG. 18(e) represents a waveform of the second power-on reset signal POR2, FIG. 18(f) represents a waveform of the control signal CON, and FIG. 18(g) represents a waveform of the internal clock signal ICLK.

After the power supply voltage Vcc is generated as shown in FIG. 18(a), the first power-on reset signal POR1 is turned from the "L" level to the "H" level in accordance with the rising edge of the power supply voltage Vcc as shown in FIG. 18(b). The first internal circuit 2 is reset by the rising edge of the first power-on reset signal POR1, and then the internal power supply voltage IVcc, which was indeterminate before the power supply voltage Vcc is generated, is determined by the reset operation of the first internal circuit 2 as shown in FIG. 18(c). Also, after the power supply voltage Vcc is generated, the PLL circuit 70 of the second internal circuit 4 begins to operate in response to the rising edge of the power supply voltage Vcc so that the phase of the divided frequency clock signal DCLK can coincide with the phase of the external clock signal ECLK. Then, the internal clock signal ICLK, which was indeterminate before the power supply voltage Vcc is generated, is determined as shown in FIG. 18(g).

When the phase of the divided frequency clock signal DCLK corresponds with the phase of the external clock signal ECLK, the determination signal LCKOK, which represents that the internal clock signal ICLK is determined, is turned from the "L" level to the "H" level as shown in FIG. 18(d). Also, since the first power-on reset signal POR1 is kept in the "H" level at this moment, the NAND circuit NA41 generates an output signal which is turned from the "H" level to the "L" level. Therefore, the second power-on reset signal POR2 output from the inverter IV41 is turned from the "L" level to the "H" level as shown in FIG. 18(e). The control circuit 3 is reset by the rising edge of the second power-on reset signal POR2, and then the control signal CON, which was indeterminate before the second power-on reset signal POR2 is generated, is determined by the reset operation of the control circuit 3 as shown in FIG. 18(f).

According to the fourth preferred embodiment, the second power-on reset signal is generated by delaying the first power-on reset signal after the internal clock signal is determined, and the control circuit receives the determinate internal clock signal in advance of the second power-on reset signal. That is, the control circuit is reset by the second power-on reset signal after the determinate internal clock signal is input to the control circuit. Therefore, the control circuit can be properly reset when the power supply voltage is generated. Also, since the second power-on reset circuit generates the second power-on reset signal after receiving the first power-on reset signal from the first power-on reset circuit and the determination signal from the PLL circuit of the second internal circuit, the control circuit can be accurately reset during the start-up process of the semiconductor integrated circuit. In addition, since the second power-on reset circuit consists of the NAND circuit and the inverter, the area of the semiconductor integrated circuit can be restrained from increasing.

Figure 19:
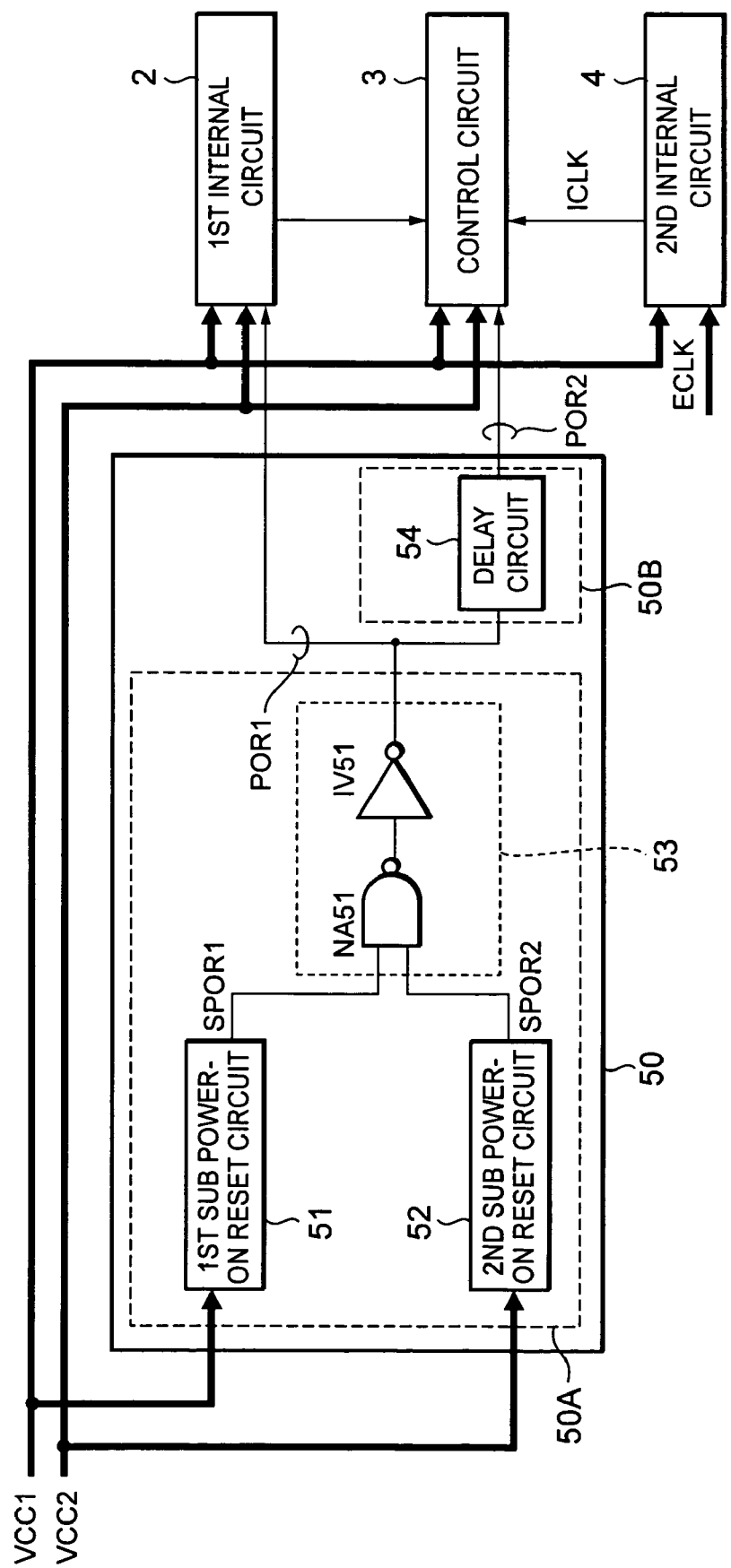
FIG. 19 is a schematic circuit diagram for describing a semiconductor integrated circuit of a semiconductor memory device according to a fifth preferred embodiment of the present invention.

FIG. 19 is a schematic circuit diagram for describing a semiconductor integrated circuit of a semiconductor memory device according to a fifth preferred embodiment of the present invention. The semiconductor integrated circuit according to the fifth preferred embodiment has a power-on reset circuit 50, the first internal circuit 2, the control circuit 3 and the second internal circuit 4. The configuration of the power-on reset circuit 50 in the semiconductor integrated circuit according to the fifth preferred embodiment is different than that according to the first to fourth preferred embodiments. Also, the electrical source terminal is a first electrical source terminal which receives a first power supply voltage Vcc1. The power-on reset circuit 50, the first internal circuit 2 and the control circuit 3 are respectively coupled with the first electrical source terminal and a second electrical source terminal which receives a second power supply voltage Vcc2. The second power supply voltage Vcc2 is generated at a rise time which is longer than a rise time at which the first power supply voltage Vcc1 is generated. A magnitude relation between the rise times of the first and second power supply voltages Vcc1 and Vcc2 depends on a magnitude relation between the voltage values of them. The second internal circuit 4 is coupled with the first electrical source terminal and not with the second electrical source terminal.

The first internal circuit 2 generates a first internal power supply voltage IVcc1 based on the first power supply voltage Vcc1 and a second internal power supply voltage Vcc2 based on the second power supply voltage Vcc2 for the control circuit 3. Hereupon, for example, the first internal power supply voltage IVcc1 is a half of the first power supply voltage Vcc1 and the second internal power supply voltage IVcc2 is higher than the second power supply voltage Vcc2. The first internal circuit 2 needs to be reset by a first power-on reset signal POR1 output from the power-on reset circuit 50, during a start-up process of the semiconductor integrated circuit, that is, when the first power supply voltage Vcc1 and the second power supply voltage Vcc2 are generated. Also, the first internal circuit 2 operates without receiving a signal which is output from the control circuit 3 or the second internal circuit 4.

The control circuit 3 is coupled with the first internal circuit 2. The control circuit 3 receives the first and second power supply voltages Vcc1 and Vcc2, the first and second internal power supply voltage IVcc1 and IVcc2 and the internal clock signal ICLK output from the second internal circuit 4, and generates a control signal CON in order to control the memory circuit which stores the electronic data in the semiconductor memory device. The control circuit 3 needs to be reset by a second poser-on reset signal POR2 output from the power-on reset circuit 50 during the start-up process of the semiconductor integrated circuit. Also, the control circuit 3 operates by the internal clock signal ICLK output from the second internal circuit 4.

The second internal circuit 4 is coupled with the control circuit 3 and includes a PLL circuit. The second internal circuit 4 generates the internal clock signal ICLK for the control circuit 3. The internal clock signal ICLK is generated based on the first power supply voltage Vcc1 and the external clock signal ECLK. The second internal circuit 4 is not reset when the first and second power supply voltages Vcc1 and Vcc2 are generated. That is, the second internal circuit 4 does not need to be reset during the start-up process of the semiconductor integrated circuit. The internal clock signal ICLK is determined by coincidence between the internal clock signal ICLK and the external clock signal ECLK in the PLL circuit.

The power-on reset circuit 50 includes a first power-on reset circuit 50A and a second power-on reset circuit 50B.

The first power-on reset circuit 50A consists of a first sub power-on reset circuit 51, a second sub power-on reset circuit 52 and an AND circuit 53. The second power-on reset circuit 50B consists of a delay circuit 54. The first power-on reset circuit 50A generates the first power-on reset signal POR1 for the first internal circuit 2 when the first power supply voltage Vcc1 is generated. The first power-on reset signal POR1 is also provided to the second power-on reset circuit 50B. A rising edge of the first power-on reset signal POR1 resets the first internal circuit 2. The second power-on reset circuit 50B delays the first power-on reset signal POR1 to generate a second power-on reset signal POR2 for the control circuit 3 when the first and second power supply voltages Vcc1 and Vcc2 are generated. That is, the second power-on reset signal POR2 is generated after the rising edge of the first power-on reset signal POR1, and a rising edge of the second power-on reset signal POR2 resets the control circuit 3.

Figure 20A:
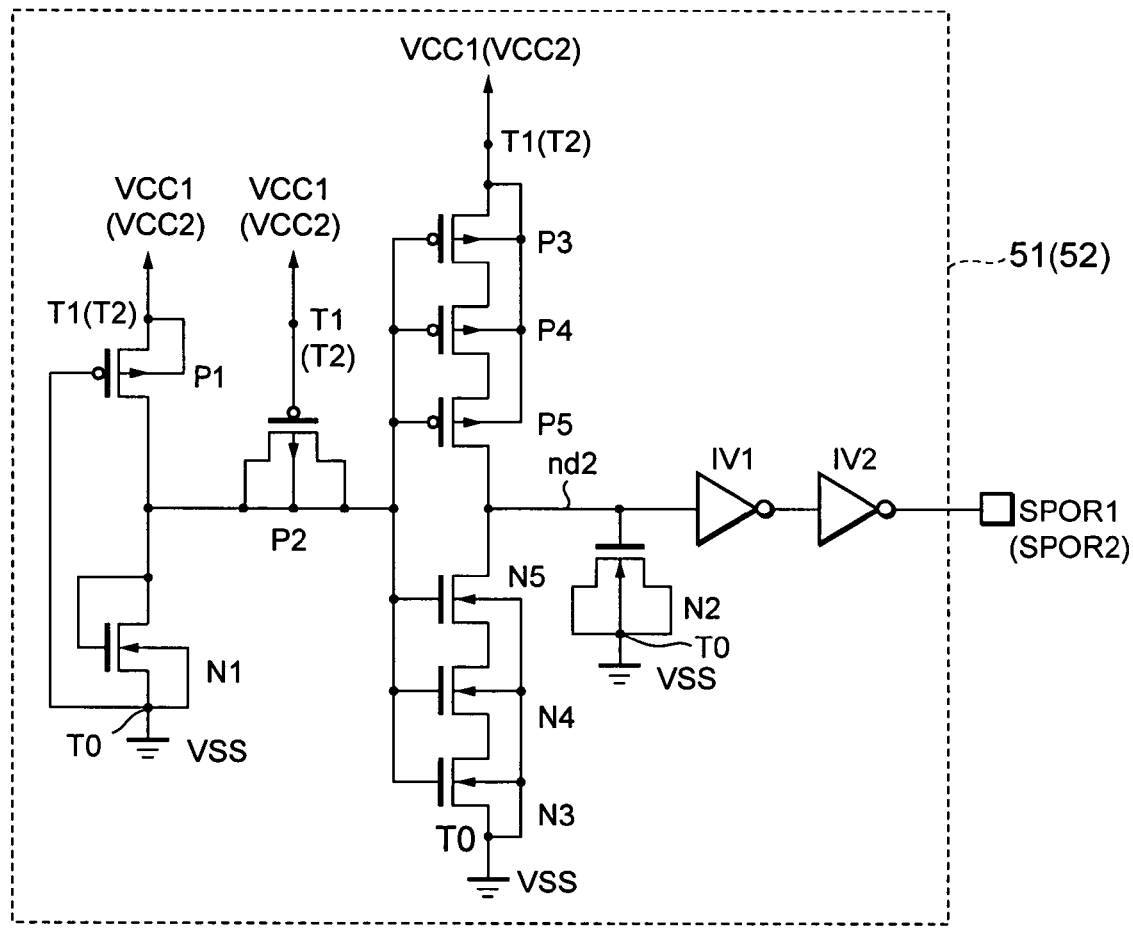
FIG. 20A is a circuit diagram for describing the first or second sub power-on reset circuit according to the fifth preferred embodiment.

FIG. 20A is a circuit diagram for describing the first sub power-on reset circuit 51 or the second sub power-on reset circuit 52. Each of the first and second sub power-on reset circuits 51 and 52 has a similar circuit configuration to the first power-on reset circuit 11 according to the first preferred embodiment as shown in FIG. 5. However, in this example, the first sub power-on reset circuit 51 is coupled with the first electrical source terminal T1 to operate based on the first power supply voltage Vcc1 and the second sub power-on reset circuit 52 is coupled with the second electrical source terminal T2 to operate based on the second power supply voltage Vcc2. The first sub power-on reset circuit 51 generates a first sub power-on reset signal SPOR1 in response to a rising edge of the first power supply voltage Vcc1. The second sub power-on reset circuit 52 generates a second sub power-on reset signal SPOR2 in response to a rising edge of the second power supply voltage Vcc2. Also, the AND circuit 53 consists of a NAND circuit NA51 and an inverter IV51. The NAND circuit NA51 is coupled with the first and second sub power-on reset circuits 51 and 52 to generate a signal based on the first and second sub power-on reset signals SPOR1 and SPOR2 for the inverter IV51. The inverter IV51 generates the first power-on reset signal POR1 for the first internal circuit 2 and the second power-on reset circuit 50B. That is, in this example, the first power-on reset signal POR1 is generated in response to the second power supply voltage Vcc2 which is generated at the rise time which is longer than the rise time at which the first power supply voltage Vcc1 is generated.

Figure 20B:
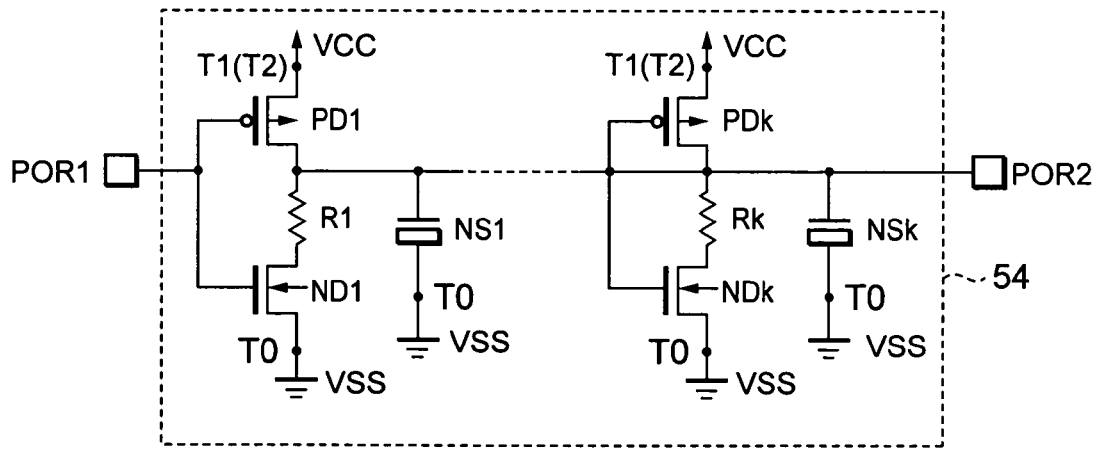
FIG. 20B is a circuit diagram for describing the second power-on reset circuit according to the fifth preferred embodiment.

FIG. 20B is a circuit diagram for describing the second power-on reset circuit 50B. The second power-on reset circuit 50B has a similar circuit configuration to the second power-on reset circuit 12 according to the first preferred embodiment as shown in FIG. 5. However, in this example, the second power-on reset signal 50B is coupled either with the first electrical source terminal T1 to operate based on the first power supply voltage Vcc1 or with the second electrical source terminal T2 to operate based on the second power supply voltage Vcc2. The second power-on reset circuit 50B generates the second power-on reset signal POR2 by delaying the first power-on reset signal POR1.

Figure 21:
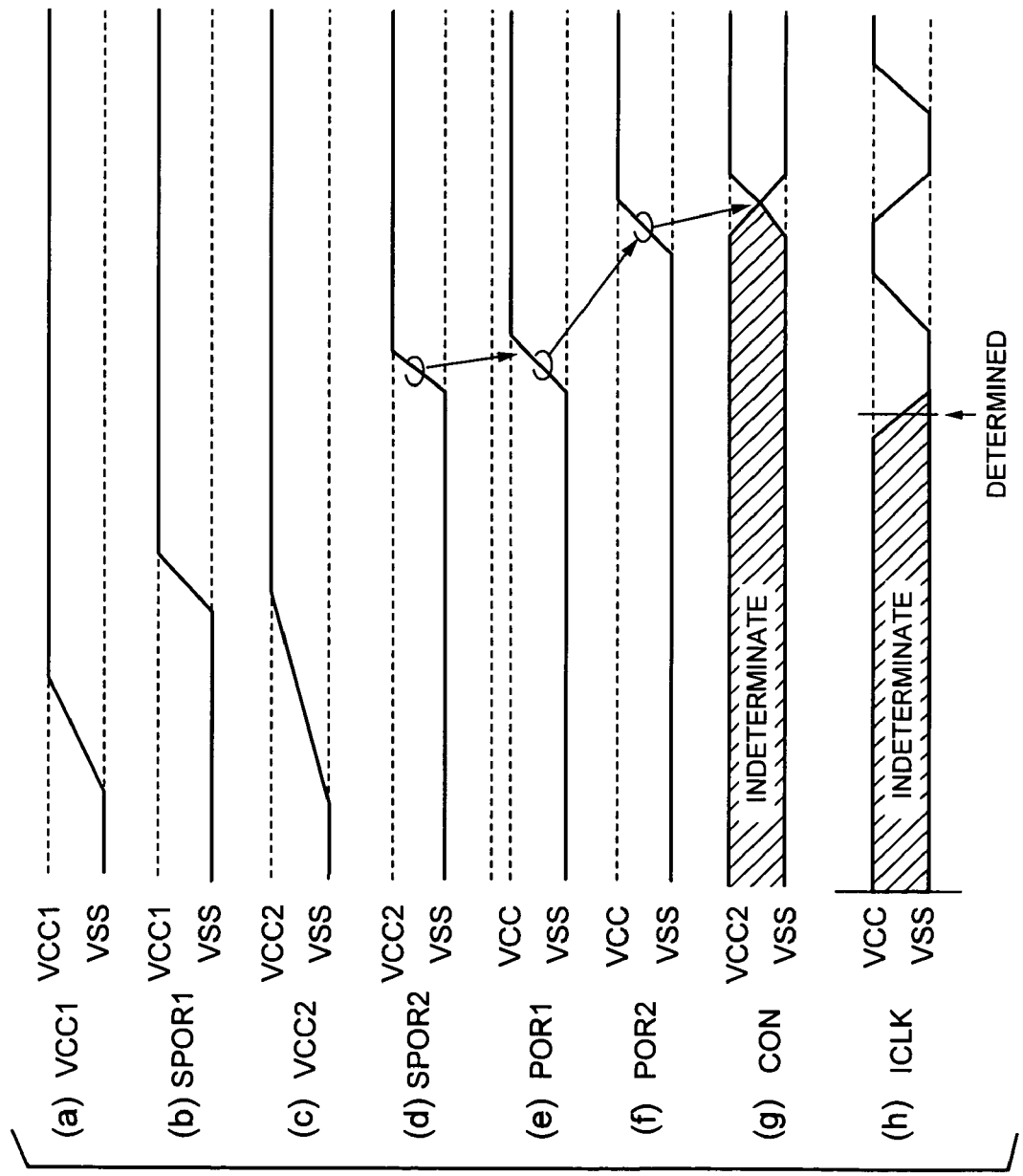
FIG. 21 is a waveform diagram describing a reset operation of the semiconductor integrated circuit in FIG. 19.

The operation of the semiconductor integrated circuit according to the fifth preferred embodiment of the present invention is described below. FIGS. 21(*a*) through 21(*h*) are signal waveform diagrams for describing the semiconductor integrated circuit in FIG. 19. FIG. 21(*a*) represents a waveform of the first power supply voltage Vcc1, FIG. 21(*b*) represents a waveform of the first sub power-on reset signal SPOR1, FIG. 21(*c*) represents a waveform of the second power supply voltage Vcc2, FIG. 21(d) represents a waveform of the second sub power-on reset signal SPOR2, FIG. 21(e) represents a waveform of the first power-on reset signal POR1, FIG. 21(f) represents a waveform of the second power-on reset signal POR2, FIG. 21(g) represents a waveform of the control signal CON, and FIG. 21(h) represents a waveform of the internal clock signal ICLK.

After the first power supply voltage Vcc1 is generated as shown in FIG. 21(a), the first sub power-on reset signal SPOR1 is turned from the "L" level to the "H" level by the first sub power-on reset circuit 51 as shown in FIG. 21(b). In the meantime, since the second sub power-on reset signal SPOR2 is kept in the "L" level as shown in FIG. 21(d), the first power-on reset signal POR1 is still kept in the "L" level as shown in FIG. 21(e). Also, after the power supply voltage Vcc is generated, the PLL circuit 70 of the second internal circuit 4 begins to operate in response to the rising edge of the first power supply voltage Vcc1 so that the phase of the divided frequency clock signal DCLK can coincide with the phase of the external clock signal ECLK. Then, the internal clock signal ICLK, which was indeterminate before the first power supply voltage Vcc1 is generated, is determined as shown in FIG. 21(h).

When the second power supply voltage Vcc2 is generated after the generation of the first power supply voltage Vcc1 as shown in FIG. 21(c), the second sub power-on reset signal SPOR2 is turned from the "L" level to the "H" level by the second sub power-on reset circuit 52 as shown in FIG. 21(d). Furthermore, since the first sub power-on reset signal SPOR1 is kept in the "H" level at this moment as shown in FIG. 21(b), a signal output from the NAND circuit NA51 is turned from the "H" level to the "L" level. And then, the first power-on reset signal POR1 output from the inverter IV51 is turned from the "L" level to the "H" level as shown in FIG. 21(e). The first internal circuit 2 is reset by the rising edge of the first power-on reset signal POR1, and then the first and second internal power supply voltages IVcc1 and IVcc2, which was indeterminate before the first and second power supply voltages Vcc1 and Vcc2 is generated, are determined by the reset operation of the first internal circuit 2.

On the other hand, the first power-on reset signal POR1 is delayed by the delay circuit 54 of the second power-on reset circuit 50B, and then the second power-on reset signal POR2 is generated after the generation of the first power-on reset signal POR1 as shown in FIG. 21(f). The control circuit 3 is reset in response to the rising edge of the second power-on reset signal POR2, and then the control signal CON, which was indeterminate before the second power-on reset signal POR2 is generated, is determined by the reset operation of the control circuit 3 as shown in FIG. 21(g). Also, before the control circuit 3 receives the second power-on reset signal POR2, the internal clock signal ICLK is already determined as shown in FIG. 21(h). Therefore, the control circuit 3 which operates based on the internal clock signal ICLK can be properly reset by the second power-on reset signal POR2.

According to the fifth preferred embodiment, the second power-on reset signal is generated by delaying the first power-on reset signal after the internal clock signal is determined, and the control circuit receives the determinate internal clock signal ahead of the second power-on reset signal. That is, the control circuit is reset by the second power-on reset signal after the determinate internal clock signal is input to the control circuit. Therefore, the control circuit can be properly reset when the first and second power supply voltages are generated. Also, according to the fifth preferred embodiment, when the first internal clock circuit and the control circuit receive the first and second power supply voltages which are generated at the different rise times, the first power-on reset signal is generated based on the second power supply voltage which is generated at the rise time which is longer than the rise time at which the first power supply voltage Vcc1 is generated. Therefore, the first internal clock circuit and the control circuit can be accurately reset.

What is claimed is:

1. A semiconductor integrated circuit which operates in accordance with a power supply voltage and an external clock signal in a semiconductor memory device, comprising:
    a memory circuit which stores electronic data;
    a control circuit which controls the memory circuit in accordance with the power supply voltage;
    a first internal circuit which generates an internal power supply voltage for the control circuit, based on the power supply voltage;
    a second internal circuit which generates an internal clock signal for the control circuit according to the external clock signal;
    a first power-on reset circuit which generates a first power-on reset signal for the first internal circuit after the power supply voltage is generated; and
    a second power-on reset circuit which generates a second power-on reset signal for the control circuit, wherein the second power-on reset signal is input to the control circuit after the internal clock signal is input to the control circuit.

2. The semiconductor integrated circuit according to claim 1, wherein the second power-on reset signal is generated from the second power-on reset circuit after the internal clock signal is generated from the second internal circuit.

3. The semiconductor integrated circuit according to claim 1, wherein the second power-on reset signal is generated from the second power-on reset circuit after the first power-on reset signal is generated from the first power-on reset circuit.

4. The semiconductor integrated circuit according to claim 1, wherein the second power-on reset signal is provided to the control circuit after the first power-on reset signal is provided to the first internal circuit.

5. The semiconductor integrated circuit according to claim 1, wherein the second power-on reset circuit is connected with the first power-on reset circuit so as to receive the first power-on reset signal.

6. The semiconductor integrated circuit according to claim 1, wherein the second power-on reset signal is generated after the first power-on reset signal.

7. The semiconductor integrated circuit according to claim 1, wherein the first internal circuit is reset by the first power-on reset signal and the control circuit is reset by the second power-on reset signal.

8. The semiconductor integrated circuit according to claim 1, wherein the second power-on reset circuit comprises:
    a trimming circuit which controls a timing at which the second power-on reset signal is generated from the second power-on reset circuit.

9. The semiconductor integrated circuit according to claim 8, wherein the trimming circuit includes a fuse which sets the timing at which the second power-on reset signal is generated from the second power-on reset circuit.

10. The semiconductor integrated circuit according to claim 1, wherein the second power-on reset circuit comprises:
a frequency dividing circuit which delays the first power-on reset signal to obtain a sub power-on reset signal, wherein the sub power-on reset signal is used to generate the second power-on reset signal.

11. The semiconductor integrated circuit according to claim 10, wherein the frequency dividing circuit comprises:
an oscillating circuit which generates a vibration signal;
a data holding circuit which divides a frequency of the vibration signal in accordance with the first power-on reset signal.

12. The semiconductor integrated circuit according to claim 10, wherein the second power-on reset circuit comprises:
a trimming circuit which controls a timing at which the sub power-on reset signal is used to generate the second power-on reset signal.

13. The semiconductor integrated circuit according to claim 12, wherein the trimming circuit includes a fuse which sets the timing at which the sub power-on reset signal is used to generate the second power-on reset signal.

14. The semiconductor integrated circuit according to claim 1, wherein the second internal circuit generates a coincident signal which is indicative of a coincidence between a phase of the external clock signal and a phase of the internal clock signal, and wherein the second power-on reset circuit generates the second power-on reset signal based on the coincident signal.

15. The semiconductor integrated circuit according to claim 14, wherein the second power-on reset signal is generated based on the first power-on reset signal.

16. The semiconductor integrated circuit according to claim 1, wherein the power supply voltage is a first power supply voltage, wherein the control circuit and the first internal circuit respectively receive a second power supply voltage which is generated at a rise time which is longer than a rise time at which the first power supply voltage is generated, and wherein the first power-on reset circuit comprises:
a first sub power-on reset circuit which generates a first sub power-on reset signal based on the first power supply voltage;
a second sub power-on reset circuit which generates a second sub power-on reset signal based on the second power supply voltage; and
an AND circuit which receives the first and second sub power-on reset signals and then outputs the first power-on reset signal.

17. A semiconductor integrated circuit which operates in accordance with a power supply voltage and an external clock signal in a semiconductor memory device, comprising:
a memory circuit which stores electronic data;
a control circuit which controls the memory circuit in accordance with the power supply voltage;
a first internal circuit connected with the control circuit so as to provide an internal power supply voltage to the control circuit, based on the power supply voltage;
a second internal circuit connected with the control circuit so as to provide an internal clock signal to the control circuit, based on the external clock signal;
a power-on reset circuit connected with the first internal circuit so as to provide a power-on reset signal to the first internal circuit; and
a delay circuit connected between the control circuit and the power-on reset circuit, wherein the delay circuit receives the power-on reset signal and then provides a delayed power-on reset signal based on the power-on reset signal to the control circuit, and wherein the control circuit receives the internal clock signal in advance of the delayed power-on reset signal.

18. The semiconductor integrated circuit according to claim 17, wherein the delayed power-on reset signal is generated from the delay circuit after the internal clock signal is generated from the second internal circuit.

19. The semiconductor integrated circuit according to claim 17, wherein the control circuit receives the delayed power-on reset signal after the first internal circuit receives the power-on reset signal.

20. The semiconductor integrated circuit according to claim 17, wherein the first internal circuit is reset by the power-on reset signal and the control circuit is reset by the delayed power-on reset signal.

21. The semiconductor integrated circuit according to claim 17, wherein the delay circuit comprises P-channel and N-channel MOS transistors connected in series between the power supply voltage and a ground voltage, and wherein gate electrodes of the P-channel and N-channel MOS transistors receive the power-on reset signal, and drain electrodes of the P-channel and N-channel MOS transistors provide the delayed power-on reset signal.

22. The semiconductor integrated circuit according to claim 17, wherein the delay circuit comprises:
a trimming circuit which controls a timing at which the delayed power-on reset signal begins to be generated.

23. The semiconductor integrated circuit according to claim 22, wherein the trimming circuit includes a fuse which sets the timing at which the delayed power-on reset signal is generated from the delay circuit.

24. The semiconductor integrated circuit according to claim 17, wherein the delay circuit comprises:
a frequency dividing circuit which delays the power-on reset signal to obtain a sub power-on reset signal, wherein the sub power-on reset signal is used to generate the delayed power-on reset signal.

25. The semiconductor integrated circuit according to claim 24, wherein the frequency dividing circuit comprises:
an oscillating circuit which generates a vibration signal;
a data holding circuit which divides a frequency of the vibration signal in accordance with the power-on reset signal.

26. The semiconductor integrated circuit according to claim 24, wherein the delay circuit comprises:
a trimming circuit which controls a timing at which the sub power-on reset signal is used to generate the delayed power-on reset signal.

27. The semiconductor integrated circuit according to claim 26, wherein the trimming circuit includes a fuse which sets the timing at which the sub power-on reset signal is used to generate the delayed power-on reset signal.

28. The semiconductor integrated circuit according to claim 1, wherein the second internal circuit generates a coincident signal which is indicative of a coincidence between a phase of the external clock signal and a phase of the internal clock signal, and wherein the delay circuit generates the delayed power-on reset signal based on the coincident signal.

29. The semiconductor integrated circuit according to claim 17, wherein the power supply voltage is a first power supply voltage, wherein the control circuit and the first internal circuit respectively receive a second power supply voltage which is generated at a rise time which is longer than a rise time at which the first power supply voltage is generated, and wherein the power-on reset circuit comprises:

a first sub power-on reset circuit which generates a first sub power-on reset signal based on the first power supply voltage;

a second sub power-on reset circuit which generates a second sub power-on reset signal based on the second power supply voltage; and an AND circuit which receives the first and second sub power-on reset signals and then outputs the power-on reset signal.

* * * * *